(12) United States Patent
Peters

(10) Patent No.: US 9,080,046 B2
(45) Date of Patent: Jul. 14, 2015

(54) EPOXYBENZYL-TERMINATED POLY(ARYLENE ETHER)S, METHOD FOR PREPARATION THEREOF, AND CURABLE COMPOSITIONS COMPRISING SAME

(71) Applicant: Edward Norman Peters, Lenox, MA (US)

(72) Inventor: Edward Norman Peters, Lenox, MA (US)

(73) Assignee: SABIC GLOBAL TECHNOLOGIES B.V. (NL)

( * ) Notice: Subject to any disclaimer, the term of this patent is extended or adjusted under 35 U.S.C. 154(b) by 60 days.

(21) Appl. No.: 14/071,742

(22) Filed: Nov. 5, 2013

(65) Prior Publication Data
US 2014/0058014 A1 Feb. 27, 2014

Related U.S. Application Data

(62) Division of application No. 13/224,050, filed on Sep. 1, 2011, now Pat. No. 8,598,281.

(51) Int. Cl.

| | |
|---|---|
| *C08K 7/14* | (2006.01) |
| *C08G 59/50* | (2006.01) |
| *C08L 63/00* | (2006.01) |
| *C08L 63/02* | (2006.01) |
| *B32B 27/04* | (2006.01) |
| *B32B 27/38* | (2006.01) |
| *B32B 37/18* | (2006.01) |
| *H05K 1/03* | (2006.01) |
| *C08K 3/00* | (2006.01) |
| *C08K 5/01* | (2006.01) |
| *C08K 5/02* | (2006.01) |
| *C08K 5/06* | (2006.01) |
| *C08K 5/07* | (2006.01) |
| *C08K 5/101* | (2006.01) |
| *C08K 5/315* | (2006.01) |
| *C08K 3/28* | (2006.01) |
| *C08G 59/42* | (2006.01) |
| *C08G 59/54* | (2006.01) |
| *C08G 59/68* | (2006.01) |
| *C08L 63/04* | (2006.01) |
| *C08L 63/06* | (2006.01) |
| *C08G 65/48* | (2006.01) |
| *C08L 71/12* | (2006.01) |
| *C08J 5/24* | (2006.01) |
| *C08K 3/22* | (2006.01) |
| *C08K 3/38* | (2006.01) |

(52) U.S. Cl.
CPC .......... *C08L 63/00* (2013.01); *B32B 27/04* (2013.01); *B32B 27/38* (2013.01); *B32B 37/18* (2013.01); *C08G 59/4215* (2013.01); *C08G 59/4223* (2013.01); *C08G 59/4276* (2013.01); *C08G 59/54* (2013.01); *C08G 59/686* (2013.01); *C08G 65/485* (2013.01); *C08J 5/24* (2013.01); *C08K 3/0033* (2013.01); *C08K 3/28* (2013.01); *C08K 3/38* (2013.01); *C08K 5/01* (2013.01); *C08K 5/02* (2013.01); *C08K 5/06* (2013.01); *C08K 5/07* (2013.01); *C08K 5/101* (2013.01); *C08K 5/315* (2013.01); *C08K 7/14* (2013.01); *C08L 63/04* (2013.01); *C08L 63/06* (2013.01); *C08L 71/126* (2013.01); *H05K 1/0366* (2013.01); *H05K 1/0373* (2013.01); *B32B 2260/023* (2013.01); *B32B 2260/046* (2013.01); *B32B 2305/076* (2013.01); *B32B 2457/08* (2013.01); *C08J 2371/12* (2013.01); *C08K 2003/2217* (2013.01); *C08K 2003/2227* (2013.01); *C08K 2003/382* (2013.01); *Y10T 156/10* (2015.01); *Y10T 428/24802* (2015.01)

(58) Field of Classification Search
None
See application file for complete search history.

(56) References Cited

U.S. PATENT DOCUMENTS

| | | |
|---|---|---|
| 3,334,110 A | 8/1967 | Schramm |
| 4,665,137 A | 5/1987 | Percec |
| 4,871,816 A | 10/1989 | Percec et al. |
| 4,912,172 A | 3/1990 | Hallgren et al. |
| 5,582,872 A | 12/1996 | Prinz |
| 5,622,588 A | 4/1997 | Weber |
| 5,834,565 A | 11/1998 | Tracy et al. |
| 6,995,195 B2 | 2/2006 | Ishii et al. |
| 7,276,563 B2 | 10/2007 | Ishii et al. |
| 7,595,367 B2 | 9/2009 | Carrillo et al. |

(Continued)

FOREIGN PATENT DOCUMENTS

| | | |
|---|---|---|
| JP | 06041331 A | 2/1994 |
| WO | 2007037940 A1 | 4/2007 |

(Continued)

OTHER PUBLICATIONS

Chao, et al.; "Poly(2,6-Dimethyl-1,4-Phenylene Ether) (PPE) Redistribution and Its Significance in the Preparation of PPE/Epoxy Laminate"; Reactive Polymers; 15; pp. 9-23; (1991).

(Continued)

*Primary Examiner* — Robert Sellers
(74) *Attorney, Agent, or Firm* — Cantor Colburn LLP

(57) ABSTRACT

An epoxybenzyl-terminated poly(arylene ether) has the structure R—W—R wherein W is a divalent poly(arylene ether) residue terminated with phenolic oxygen atoms, and R is an epoxybenzyl group, wherein each occurrence of R is the same or different. The epoxybenzyl-terminated poly(arylene ether) is formed by reacting a peroxide-containing reagent with a vinylbenzyl-terminated poly(arylene ether). Also disclosed is a curable composition including the epoxybenzyl-terminated poly(arylene ether)s, a curing promoter, and, optionally, an auxiliary epoxy resin. The curable composition is useful for the preparation of composites, and in particular, composites used in manufacturing printed circuit boards.

26 Claims, 2 Drawing Sheets

(56) References Cited

U.S. PATENT DOCUMENTS

| | | | |
|---|---|---|---|
| 7,655,278 | B2 | 2/2010 | Braidwood et al. |
| 2004/0132941 | A1 | 7/2004 | Ishii et al. |
| 2004/0214004 | A1 | 10/2004 | Amagai et al. |
| 2005/0065241 | A1* | 3/2005 | Ishii et al. ............ 523/400 |
| 2005/0090624 | A1 | 4/2005 | Norisue et al. |
| 2006/0041068 | A1 | 2/2006 | Ohno et al. |
| 2008/0300350 | A1 | 12/2008 | Ohno et al. |
| 2009/0012331 | A1 | 1/2009 | Nakano et al. |
| 2009/0203279 | A1 | 8/2009 | Mori et al. |
| 2009/0247032 | A1 | 10/2009 | Mori et al. |

FOREIGN PATENT DOCUMENTS

| | | |
|---|---|---|
| WO | 2008033611 A1 | 3/2008 |
| WO | 2008054893 A1 | 5/2008 |
| WO | 2008089314 A1 | 7/2008 |

OTHER PUBLICATIONS

Griffiths, "Farnborough Airshow Report 2006", Composites World. com, Sep. 2006 last downloaded from http://www.compositesworld.com/articles/farnborough-airshow-report-2006, on Sep. 29, 2011, 1 page.

HEXCEL Publication No. FGU 017b, "Prepreg Technology", Mar. 2005, last downloaded from http://www.hexcel.com/Resources/DataSheets/Brochure-Data-Sheets/Prepreg_Technology.pdf, on Sep. 29, 2011, 34 pages.

HEXCEL Publication No. ITA 272, "Advanced Fibre Reinforced Matrix Products for Direct Processes", Jun. 2005, last downloaded from http://www.hexcel.com/Resources/DataSheets/Brochure-Data-Sheets/Advanced_Fibre-Reinforced_Matrix_Products_for_Direct_Processes.pdf, 14 pages.

Hibbert, et al.; Organic Syntheses, Col. vol. 1, p. 494 (1941); vol. 8, p. 102 (1928).

IPC-TM-650 Test Methods Manual; "Permittivity and Loss Tangent, Parallel Plate, 1 MHz to 1.5 GHz"; No. 2.5.5.9; Nov. 1998; 5 Pages.

International Search Report and Written Opinion; International Application No. PCT/US2012/051367; International Filing Date Aug. 17, 2012; Date of Mailing Feb. 28, 2013; 8 pages.

J March "Advanced Organic Chemistry Reactions, Mechanisms, and Structure"; Second Edition; McGraw-Hill Book Company; 1977; 6 pages.

Pham, et al.; 2004; Epoxy Resins; Encyclopedia of Polymer Science and Technology; John Wiley & Sons, Inc., vol. 6; pp. 678-804.

Su et al. "Preparation Characterization and Curing Properties of Epoxy-Terminated Poly(alkyl-phenylene Oxide)s"; 2010; European Polymer Journal vol. 46; pp. 1488-1497; 10 pages.

Nava, Hildeberto and Percec, Virgil, "Functional Polymers and Sequential Copolymers by Phase Transfer Catalysis", Journal of Polymer Science: Part A: Polymer Chemistry, vol. 24, 965-990 (1986).

* cited by examiner (a)  (b)

(a)  (b)

EPOXYBENZYL-TERMINATED POLY(ARYLENE ETHER)S, METHOD FOR PREPARATION THEREOF, AND CURABLE COMPOSITIONS COMPRISING SAME

CROSS REFERENCE TO RELATED APPLICATIONS

This application is a division of U.S. Nonprovisional application Ser. No. 13/224,050 filed Sep. 1, 2011, now U.S. Pat. No. 8,598,281, and is hereby incorporated by reference in its entirety.

BACKGROUND OF THE INVENTION

Epoxy resins are high performance materials used in a wide variety of applications including protective coatings, adhesives, electronic laminates (such as those used in the fabrication of computer circuit boards), flooring and paving applications, glass fiber-reinforced pipes, and automotive parts (including leaf springs, pumps, and electrical components). In their cured form, epoxy resins offer desirable properties including good adhesion to other materials, excellent resistance to corrosion and chemicals, high tensile strength, and good electrical resistance. Two challenges associated with the use of epoxy resins are the brittleness of the cured epoxy resins and the need to heat many curable epoxy compositions enough to prepare, blend and shape them, but not so much as to cure them prematurely.

Poly(arylene ether) resin is a type of plastic known for its excellent water resistance, dimensional stability, and inherent flame retardancy. The addition of a poly(arylene ether) to an epoxy resin can reduce the brittleness of the epoxy resin. For example, U.S. Pat. No. 4,912,172 to Hallgren et al. describes a composition including a specific epoxy resin and a polyphenylene ether having a number average molecular weight of at least about 12,000. However, relatively high temperatures are required to dissolve the polyphenylene ether in the epoxy resin, and premature curing of the epoxy resin is a risk at those high temperatures.

As another example, U.S. Pat. No. 5,834,565 to Tracy et al. describes compositions including an epoxy resin and a poly(arylene ether) having a number average molecular weight less than 3,000. The low molecular weight poly(arylene ether) is easier to dissolve in the epoxy resin than higher molecular weight poly(arylene ether)s. However, the products obtained on curing these compositions are not as tough as those prepared with higher molecular weight poly(arylene ether)s.

The poly(arylene ether)s in the Hallgren and Tracy patents are monofunctional, i.e. they possess one terminal phenolic group. U.S. Pat. No. 7,655,278 to Braidwood et al. describes compositions including an epoxy resin and a poly(arylene ether) having two terminal phenolic groups. These compositions are easier to dissolve in the epoxy resin, and can advantageously be dissolved at 10 to 40° C.

Despite the higher solubility of bifunctional poly(arylene ether)s over monofunctional poly(arylene ether)s and the known reactivity of phenols with epoxy resins, both monofunctional and bifunctional hydroxyl-terminated poly(arylene ether)s are relatively unreactive with epoxy resins at or near room temperature. The base catalyzed reaction of the terminal phenolic groups with epoxy resins is a slow reaction, which can require high temperatures and long times for complete curing. This lower reactivity is problematic in diamine cured epoxy compositions. In general, stoichiometric or close to stoichiometric quantities of diamines are used to cure epoxy systems. The reactivity of epoxy resins with diamine hardeners is significantly higher than with phenolic compounds. With diamine hardeners, curing can occur under ambient conditions. Therefore, in ternary resin compositions comprising poly(arylene ether), epoxy resin, and diamine hardener, the epoxy resin reacts preferentially with the diamine hardener. There is little or no reaction of the epoxy resin with the poly(arylene ether), and there is little or no incorporation of the poly(arylene ether) into the thermoset matrix formed by reaction of the epoxy resin and the diamine hardener. The presence of unreacted poly(arylene ether) can have adverse effects on the cured epoxy resin composition, such as dual phase morphology, poor solvent resistance, and reduced impact strength.

One solution to the low reactivity of the phenolic end groups of the poly(arylene ether) is to "up-stage" the poly(arylene ether). Up-staging is the partial reaction of poly(arylene ether) with epoxy resin at elevated temperatures with or without a catalyst. Temperatures for up-staging can be as high as 250° C., and the reaction can take several hours. Not every epoxy resin formulator has the equipment or time to do up-staging.

Another solution to the low reactivity of the phenolic end groups of the poly(arylene ether) is to use poly(arylene ether) terminated with glycidyl ether groups. Poly(arylene ether) terminated with glycidyl ether groups are disclosed, for example, in U.S. Pat. No. 7,276,563 B2 to Ishii et al., U.S. Patent Application Publication No. US2004/0214004 A1 of Amagai et al., and C.-T. Su, K.-Y. Lin, T.-J. Lee, and M. Liang, *European Polymer Journal*, volume 46, pages 1488-1497, 2010. However these polymers are produced using a large (e.g., about 30-fold) stoichiometric excess of epichlorohydrin. The large excesses of epichlorohydrin are used to minimize copolymerization of the epichlorohydrin with the poly(arylene ether) intermediate. Epichlorohydrin is not an environmentally friendly chemical. Thus its use in a manufacturing process, especially when it has to be used in such large excesses beyond the amount that reacts, is undesirable from industrial hygiene and environmental viewpoints.

In addition to the above problems with the process for making prior art glycidyl ether terminated poly(arylene ether)s, poly(arylene ether)/epoxy compositions can have a two-phase polymer morphology, poor solvent resistance due to solvent extraction of unreacted poly(arylene ether) that is not incorporated into the epoxy resin matrix, and poor impact strength.

In view of the above problems associated with prior art poly(arylene ether) epoxy compositions, there remains a need for an epoxy-terminated poly(arylene ether) that is highly reactive in epoxy-containing curable compositions, especially epoxy/hardener resin compositions, while at the same time maintaining good solubility in the epoxy resin composition. There also remains a need for an epoxy-terminated poly(arylene ether) that does not require upstaging prior to use, and does not require the use of epichlorohydrin in its manufacture. In terms of epoxy resin compositions, there remains a need for poly(arylene ether)/epoxy/compositions having a single phase polymer morphology, improved solvent resistance, and improved impact strength.

BRIEF DESCRIPTION OF THE INVENTION

One embodiment is a poly(arylene ether) having the structure R—W—R, wherein W is a divalent poly(arylene ether) residue terminated with phenolic oxygen atoms, and R is an epoxybenzyl group having the structure

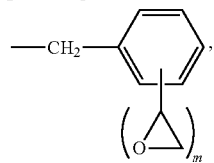

wherein each occurrence of R is the same or different, and each occurrence of m is independently 1 or 2.

Another embodiment is a poly(arylene ether) having the structure

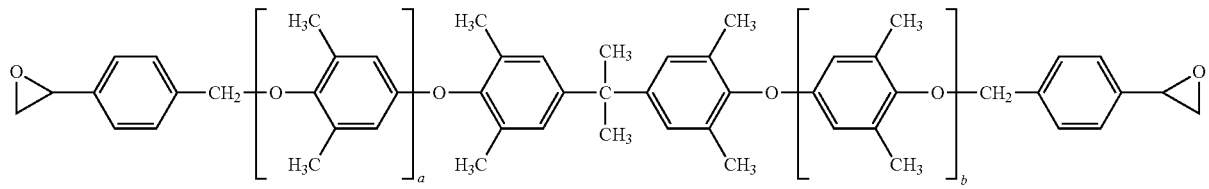

wherein each occurrence of a and b is independently 0 to about 20, provided that the sum of a and b is at least 2.

Another embodiment is a process of making the above poly(arylene ether), comprising reacting a peroxide-containing reagent with a vinylbenzyl-terminated poly(arylene ether).

Another embodiment is a process of making a poly(arylene ether), comprising: reacting a hydroxyl-terminated poly (arylene ether) having the structure

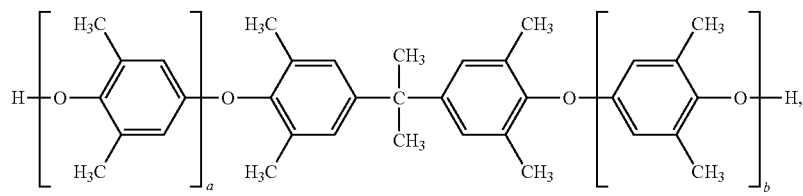

with 4-vinylbenzyl chloride to form a vinylbenzyl-terminated poly(arylene ether) having the structure

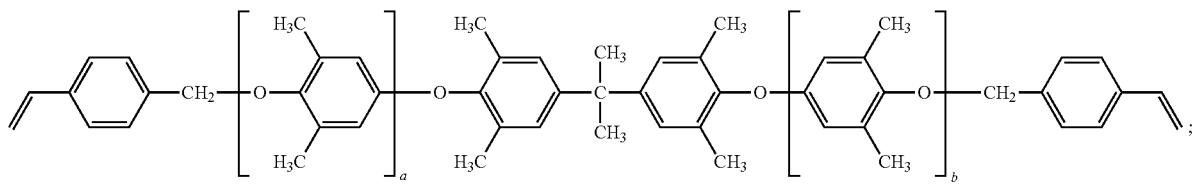

and reacting the vinylbenzyl-terminated poly(arylene ether) with a peracid to form an epoxybenzyl-terminated poly (arylene ether) having the structure

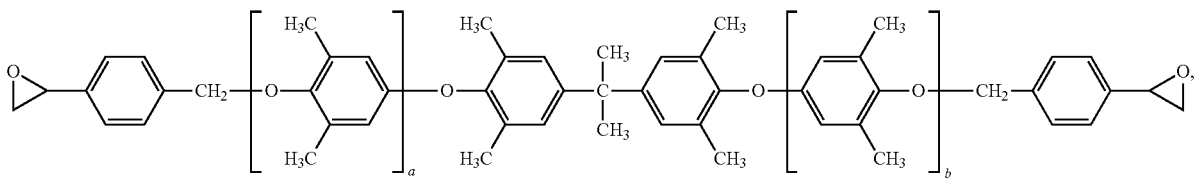

wherein each occurrence of a and b is independently 0 to about 20, provided that the sum of a and b is at least 2.

Another embodiment is a curable composition comprising an epoxybenzyl-terminated poly(arylene ether) and a curing promoter. Another embodiment is a process of making the above curable composition, comprising mixing the epoxybenzyl-terminated poly(arylene ether) and the curing promoter at about 10 to about 200° C. Another embodiment is a cured composition obtained by curing the above curable composition. Another embodiment is an article comprising the cured composition. Another embodiment is a method of forming a composite, comprising impregnating a reinforcing structure with the curable composition; partially curing the curable composition to form a prepreg; and laminating a plurality of prepregs. Other embodiments include a composite formed by the method, and a printed circuit board comprising the composite.

Another embodiment is a curable composition comprising an epoxybenzyl-terminated poly(arylene ether), an auxiliary epoxy resin, and a curing promoter. Another embodiment is a process of making the above curable composition, comprising mixing an epoxybenzyl-terminated poly(arylene ether), a curing promoter, and an auxiliary epoxy resin at about 10 to about 200° C. Another embodiment is a cured composition obtained by curing the above curable composition. Another embodiment is an article comprising the cured composition. Another embodiment is a method of forming a composite, comprising impregnating a reinforcing structure with the curable composition; partially curing the curable composition to form a prepreg; and laminating a plurality of prepregs. Other embodiments include a composite formed by the method, and a printed circuit board comprising the composite.

These and other embodiments are described in detail below.

DETAILED DESCRIPTION OF THE INVENTION

Figure 1:
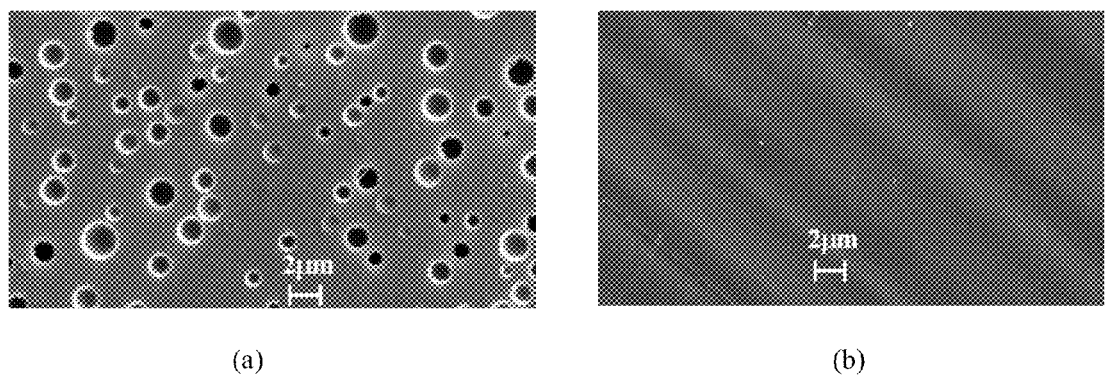
FIG. 1 depicts scanning electron microscopy (SEM) images for cured m-phenylenediamine/epoxy/poly(arylene ether) compositions after toluene etching; in image (a), the poly(arylene ether) is a hydroxyl-terminated poly(arylene ether); in image (b), the poly(arylene ether) is an epoxybenzyl-terminated poly(arylene ether).

In a search for poly(arylene ether)s that provide epoxy resin compositions having improved properties, the present inventors have developed the epoxybenzyl-terminated poly(arylene ether)s described herein. These poly(arylene ether)s provide several advantages when used in epoxy resin compositions. Epoxybenzyl-terminated poly(arylene ether)s do not need to be up-staged by partial reaction with epoxy resins prior to use in order to have sufficient cure rates. This simplifies their use for the end-user, and eliminates the burdensome need for equipment to carry out the up-staging. What's more, the epxoybenzyl-terminated poly(arylene ether)s are prepared without the use of epichlorohydrin, which is not an environmentally friendly chemical. Instead of epichlorohydrin, which must be used in about a 30-fold molar excess, epoxybenzyl-terminated poly(arylene ether)s can be produced from peracids in near stoichiometric amounts.

The epoxybenzyl-terminated poly(arylene ether)s of the present invention provide other advantages as well. Epoxy resin compositions comprising epoxybenzyl-terminated poly(arylene ether)s exhibit increased incorporation of the epoxybenzyl-terminated poly(arylene ether) into the epoxy matrix at or near room temperature relative to hydroxyl-terminated poly(arylene ether)s. The higher incorporation level results in several advantageous properties. With higher incorporation of the epoxybenzyl-terminated poly(arylene ether), a single phase polymer morphology is obtained. As demonstrated by the working examples, solvent resistance and impact resistance are improved, and water adsorption is reduced, relative to existing epoxy resin compositions.

Thus, in some embodiments, a poly(arylene ether) has the structure

R—W—R, wherein W is as divalent poly(arylene ether) residue terminated with phenolic oxygen atoms, and R is an epoxybenzyl group, wherein each occurrence of R is the same or different. As used herein, the term "epoxybenzyl group" means a benzyl group ring-substituted with one or two epoxy groups bonded directly to the aromatic ring. The epoxybenzyl group can have the structure

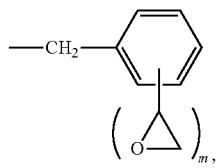

wherein each occurrence of m is independently 1 or 2. Epoxybenzyl group species include, for example,

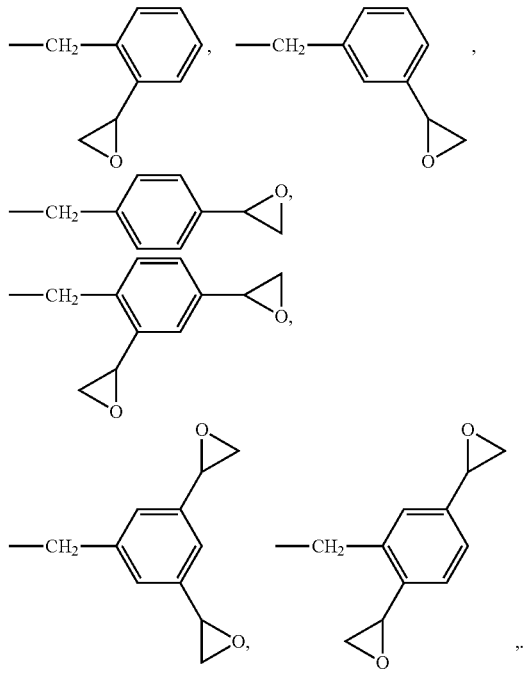

and combinations thereof. In some embodiments the epoxybenzyl group R has the structure

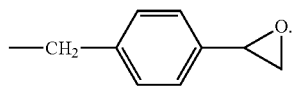

The poly(arylene ether) residue W has the structure

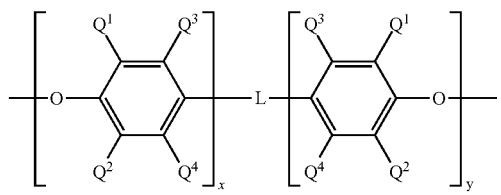

wherein $Q^1$ and $Q^2$ are each independently selected from the group consisting of halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; each occurrence of $Q^3$ and $Q^4$ is independently selected from the group consisting of hydrogen, halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; x and y are independently 0 to about 30, specifically 0 to about 20, more specifically 0 to about 15, still more specifically 0 to about 10, even more specifically 0 to about 8, provided that the sum of x and y is at least 2, specifically at least 3, more specifically at least 4; and L has the structure

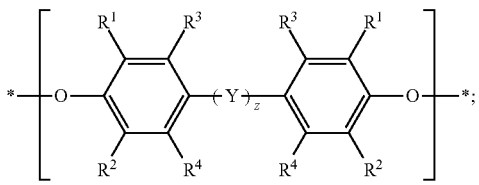

wherein each occurrence of $R^1$ and $R^2$ and $R^3$ and $R^4$ is independently selected from the group consisting of hydrogen, halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; z is 0 or 1; and Y has a structure selected from the group consisting of

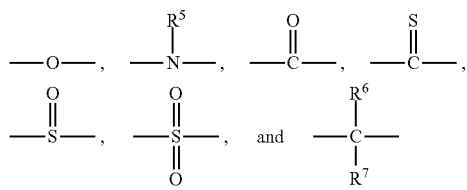

wherein each occurrence of $R^5$ is independently selected from the group consisting of hydrogen and $C_1$-$C_{12}$ hydrocarbyl, and each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

As used herein, the term "hydrocarbyl", whether used by itself, or as a prefix, suffix, or fragment of another term, refers to a residue having an open valence that contains only carbon and hydrogen. The term "primary hydrocarbyl", refers to a hydrocarbyl group having two or three hydrogen atoms bonded to the carbon atom with the open valence. The term "secondary hydrocarbyl" refers to a hydrocarbyl group having one hydrogen atom bonded to the carbon atom with the open valence. The hydrocarbyl residue can be aliphatic or aromatic, straight-chain, cyclic, bicyclic, branched, saturated, or unsaturated. It can also contain combinations of aliphatic, aromatic, straight chain, cyclic, bicyclic, branched, saturated, and unsaturated hydrocarbon moieties. However, when the hydrocarbyl residue is described as substituted, it can, optionally, contain heteroatoms over and above the carbon and hydrogen members of the substituent residue. Thus, when specifically described as substituted, the hydrocarbyl residue can also contain one or more heteroatoms such as halogens, oxygen, nitrogen, sulfur, silicon, or phosphorus. When substituted, the hydrocarbyl residue can contain the heteroatoms pendant to or within the backbone of the hydrocarbon residue. As one example, $Q^1$ or $Q^2$ can be a di-n-butylaminomethyl group formed by reaction of a methyl group of a 2,6-dimethylphenylene residue with the di-n-butylamine component of an oxidative polymerization catalyst.

In some embodiments, the poly(arylene ether) can comprise a mixture of poly(arylene ether) species having different epoxybenzyl R groups. For example, the poly(arylene ether) can comprise a poly(arylene ether) species in which the epoxybenzyl R groups are both

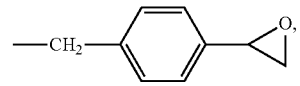

a poly(arylene ether) species in which the epoxybenzyl R groups are both

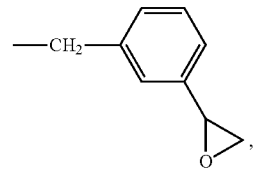

and a poly(arylene ether) species in which the epoxybenzyl R groups are

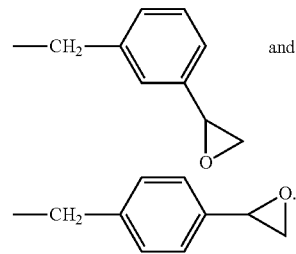

In some embodiments, the poly(arylene ether) has the structure

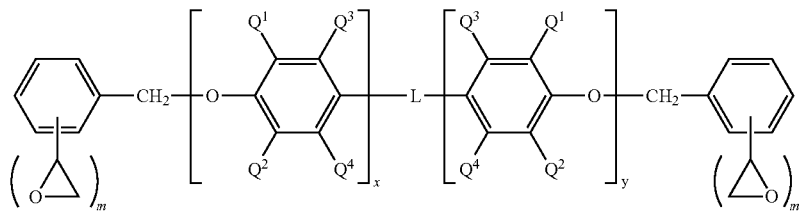

wherein each occurrence of m is independently 1 or 2; $Q^1$ and $Q^2$ are each independently selected from the group consisting of halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; each occurrence of $Q^3$ and $Q^4$ is independently selected from the group consisting of hydrogen, halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; x and y are independently 0 to about 30, provided that the sum of x and y is at least 2; and L has the structure

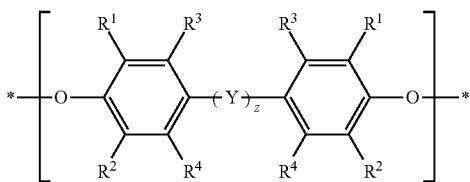

wherein each occurrence of $R^1$ and $R^2$ and $R^3$ and $R^4$ is independently selected from the group consisting of hydrogen, halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; z is 0 or 1; and Y has a structure selected from the group consisting of

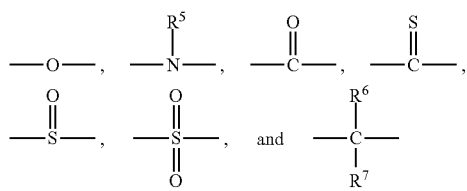

wherein each occurrence of $R^5$ is independently selected from the group consisting of hydrogen and $C_1$-$C_{12}$ hydrocarbyl, and each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

In some embodiments, the poly(arylene ether) has the structure wherein each occurrence of a and b is independently 0 to about 20, provided that the sum of a and b is at least 2.

In some embodiments, a process of making a poly(arylene ether) having the structure

wherein W is a divalent poly(arylene ether) residue terminated with phenolic oxygen atoms, and R is an epoxybenzyl group having the structure

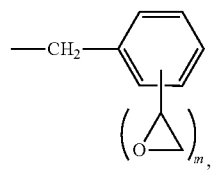

wherein each occurrence of R is the same or different, and each occurrence of m is independently 1 or 2, comprises reacting a peroxide-containing reagent with a vinylbenzyl-terminated poly(arylene ether). The poly(arylene ether) residue W is as defined above.

Suitable peroxide-containing reagents include aliphatic or aromatic peracid perbenzoic acid, 3-chloroperbenzoic acid, monoperphthalic acid, p-methoxyperbenzoic acid, p-nitroperbenzoic acid, m-nitroperbenzoic acid, α-pernaphthoic acid, β-pernaphthoic acid, phenylperacetic acid, performic acid, peracetic acid, perpropionic acid, perbutyric acid perisovaleric acid, perheptanoic acid, and combinations thereof. In some embodiments, the peroxide-containing reagent is 3-chloroperbenzoic acid.

The vinylbenzyl-terminated poly(arylene ether) has the structure

wherein the poly(arylene ether) residue W is as defined above, and S is a vinylbenzyl group having the structure

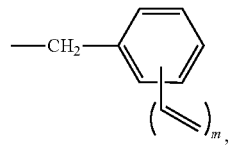

wherein each occurrence of S is the same or different, and each occurrence of m is independently 1 or 2.

In some embodiments, the vinylbenzyl-terminated poly(arylene ether) has the structure

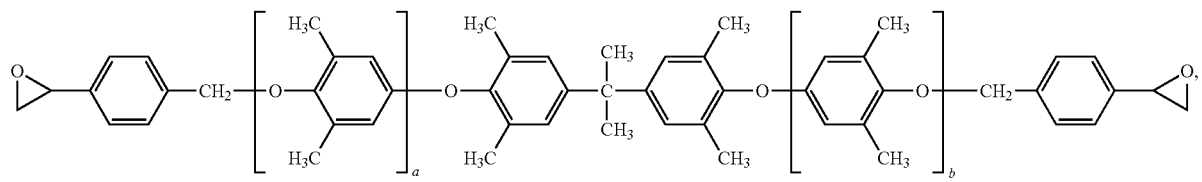

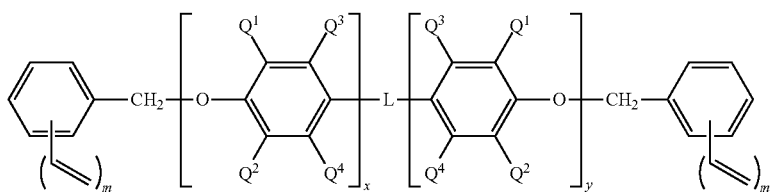

wherein L, $Q^1$-$Q^4$, m, x, and y are as defined above. In some embodiments, the vinylbenzyl-terminated poly(arylene ether) has the structure

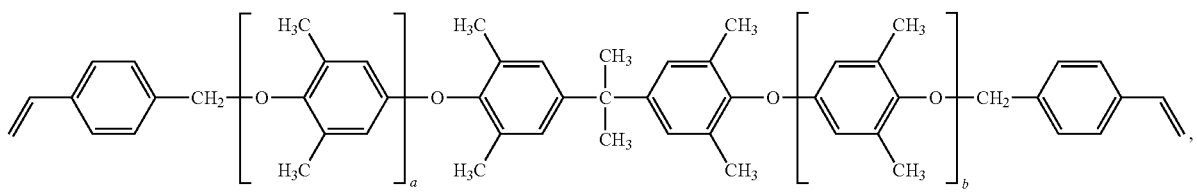

wherein each occurrence of a and b is independently 0 to about 20, provided that the sum of a and b is at least 2. Examples of the preparation of vinylbenzyl-terminated poly(arylene ether)s can be found in U.S. Patent Application Publication Nos. US 2005/0090624 A1 of Norisue et al., and US 2009/0012331 A1 of Nakano et al.

In some embodiments, the vinylbenzyl-terminated poly(arylene ether) is reacted with a 0 to about 20 mole percent excess of peracid, specifically a 0 to about 15 mole percent excess, more specifically a 0 to about 10 mole percent excess, and even more specifically a 0 to about 5 mole percent excess of peracid, based on the moles of vinyl groups present in the vinylbenzyl-terminated poly(arylene ether). Depending upon the specific peracid used, the reacting is conducted at a temperature of about −30 to about 50° C., specifically about −20 to about 40° C., still more specifically about −15 to about 30° C., even more specifically about −10 to about 20° C., and yet more specifically about −5 to about 10° C. The reacting is conducted for about 1 to about 20 hours, specifically about 2 to about 15 hours, more specifically about 3 to about 10 hours, and still more specifically about 5 to about 8 hours. In some embodiments, the reacting is conducted neat (i.e. in the absence of solvent), and in other embodiments, the reacting is conducted in the presence of a solvent. In some embodiments, the solvent is a chlorinated hydrocarbon solvent, for example chloroform. In other embodiments, the solvent is an aromatic hydrocarbon, for example toluene. In some embodiments, the acid generated by reaction of the peracid precipitates from solution, and can be separated by decantation, filtration, centrifugation, or any combination thereof. Solvent, if utilized, can be removed from the vinylbenzyl-terminated poly(arylene ether) by distillation, optionally at reduced pressure.

When the peroxide-containing reagent is 3-chloroperbenzoic acid, the method for the preparation of styrene oxide found in *Organic Syntheses, Coll. Vol.* 1, p. 404, 1941, and *Vol.* 8, p. 102, 1928, can be used. This method is applicable when other peracids are used as well. Any desirable modifications to the method when peracids other than 3-chloroperbenzoic acid are used will be readily apparent to the skilled person.

In some embodiments, the process further comprises reacting a hydroxyl terminated poly(arylene ether) with a vinylbenzyl halide in the presence of an alkali metal alkoxide to form the vinylbenzyl-terminated poly(arylene ether). The vinylbenzyl halide has the structure

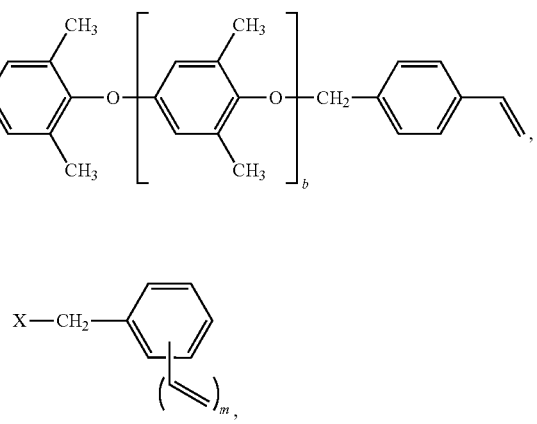

wherein X is fluoride, chloride, bromide, or iodide, and m is 1 or 2. In some embodiments, X is chloride. The vinylbenzyl halide can be 3-vinylbenzyl chloride, 4-vinylbenzyl chloride, or a combination of 3-vinylbenzyl chloride and 4-vinylbenzyl chloride. Commercially available vinylbenzyl chlorides include mixtures of 3-vinylbenzyl chloride and 4-vinylbenzyl chloride, available from Dow Chemical Co, and 4-vinylbenzyl chloride, available from Sigma-Aldrich.

Methods for preparing the vinylbenzyl halide will be readily apparent to the skilled person in the art. For example, when m is 1, the vinylbenzyl halide can be prepared by halomethylation of styrene. When m is 2, the vinylbenzyl halide can be prepared by halomethylation of divinylbenzene. Halomethylation is described in Jerry March, *Advanced Organic Chemistry*, 2nd Ed., McGraw-Hill, pp. 501-502, 1977. Both styrene and divinylbenzene are commercially available. Divinylbenzene is available as a mixture of o-divinylbenzene and p-divinylbenzene.

The hydroxyl-terminated poly(arylene ether) has the structure

H—W—H, wherein the residue W is as defined above, and H represents a hydrogen atom. In some embodiments, the hydroxyl-terminated poly(arylene ether) is a bifunctional poly(arylene ether) having the structure

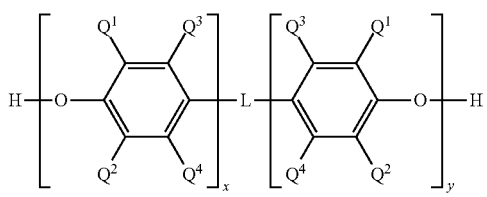

wherein $Q^1$ and $Q^2$ are identical within each phenylene ether unit and selected from the group consisting of halogen, unsubstituted or substituted $C_1$-$C_{12}$ hydrocarbyl provided that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; each occurrence of $Q^3$ and $Q^4$ is independently selected from the group consisting of hydrogen, halogen, unsubstituted or substituted $C_1$-$C_{12}$ hydrocarbyl provided that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; x and y are independently 0 to about 30, specifically 0 to about 20, more specifically 0 to about 15, still more specifically 0 to about 10, even more specifically 0 to about 8, provided that the sum of x and y is at least 2, specifically at least 3, more specifically at least 4; and L has the structure

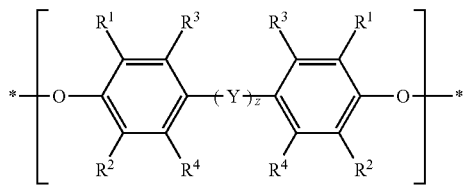

wherein each occurrence of $R^1$ and $R^2$ and $R^3$ and $R^4$ is independently selected from the group consisting of hydrogen, halogen, unsubstituted or substituted $C_1$-$C_{12}$ hydrocarbyl provided that the hydrocarbyl group is not tertiary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; z is 0 or 1; and Y has a structure selected from the group consisting of

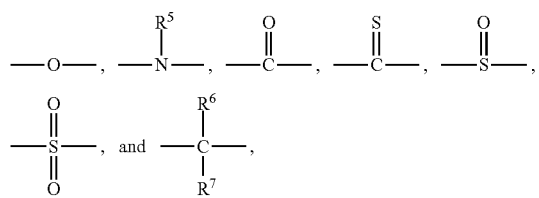

wherein each occurrence of $R^5$ is independently selected from the group consisting of hydrogen and $C_1$-$C_{12}$ hydrocarbyl, and each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group. In some embodiments, each occurrence of $Q^1$ and $Q^2$ is methyl, each occurrence of $Q^3$ is hydrogen, each occurrence of $Q^4$ is hydrogen or methyl, the sum of x and y is 2 to about 15, each occurrence of $R^1$ and $R^2$ and $R^3$ and $R^4$ is independently hydrogen or methyl, and Y has the structure

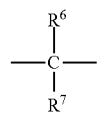

wherein each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

In the hydroxyl-terminated poly(arylene ether) structure above, there are limitations on the variables x and y, which correspond to the number of phenylene ether repeating units at two different places in the bifunctional poly(arylene ether) molecule. In the structure, x and y are independently 0 to about 30, specifically 0 to about 20, more specifically 0 to about 15, even more specifically 0 to about 10, yet more specifically 0 to about 8. The sum of x and y is at least 2, specifically at least 3, more specifically at least 4. A particular polyfunctional poly(arylene ether) resin can be analyzed by proton nuclear magnetic resonance spectroscopy ($^1$H NMR) to determine whether these limitations are met for the entire resin, on average. Specifically, $^1$H NMR can distinguish between resonances for protons associated with internal and terminal phenylene ether groups, and internal and terminal residues of a polyhydric phenol, as well as other terminal residues. It is therefore possible to determine the average number of phenylene ether repeat units per molecule, and the relative abundance of internal and terminal residues derived from dihydric phenol.

In some embodiments, the hydroxyl-terminated poly (arylene ether) has the structure

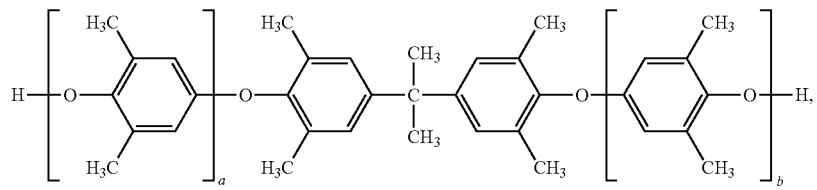

wherein each occurrence of a and b is independently 0 to about 20, provided that the sum of a and b is at least 2. This hydroxyl-terminated poly(arylene ether) can be synthesized by oxidative copolymerization of 2,6-xylenol and 2,2-bis(3,5-dimethyl-4-hydroxyphenyl)propane in the presence of a catalyst comprising copper and di-n-butylamine.

Any of the above-described poly(arylene ether)s can contain minor amounts of structural units formed as a result of side reactions occurring during poly(arylene ether) synthesis or processing. For example, when a poly(arylene ether) is prepared by method comprising oxidative polymerization of monomers comprising 2,6-dimethylphenol in the presence of a secondary amine, thermal decomposition can generate minor amounts of the structural units

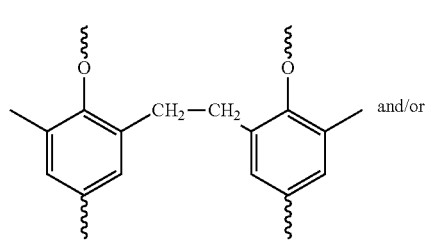 and/or

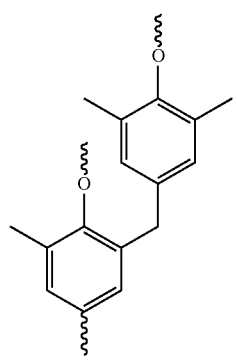

wherein the wavy bonds represent connections to the remainder of the polyfunctional poly(arylene ether) molecule.

In some embodiments, a process of making a poly(arylene ether) comprises reacting a hydroxyl-terminated poly(arylene ether) having the structure

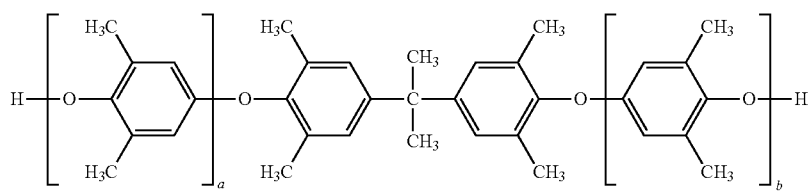

with 4-vinylbenzyl chloride to form a vinylbenzyl-terminated poly(arylene ether) having the structure

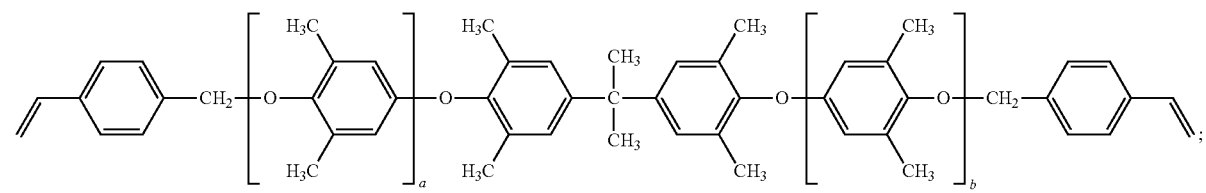

and reacting the vinylbenzyl-terminated poly(arylene ether) with a peracid to form an epoxybenzyl-terminated poly(arylene ether) having the structure

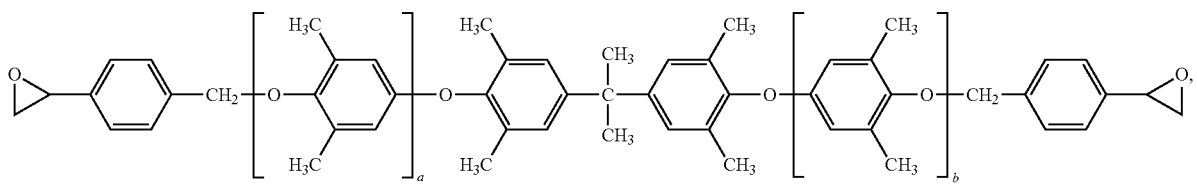

wherein each occurrence of a and b is independently 0 to about 20, provided that the sum of a and b is at least 2.

In some embodiments, a curable composition comprises a poly(arylene ether) having the structure

and a curing promoter, wherein W is a divalent poly(arylene ether) residue having terminal phenolic oxygen atoms, and R is an epoxybenzyl group having the structure

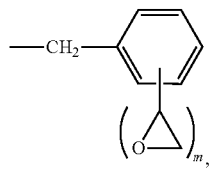

wherein each occurrence of R is the same or different, and each occurrence of m is independently 1 or 2. W is further defined above.

In some embodiments, the poly(arylene ether) has the structure

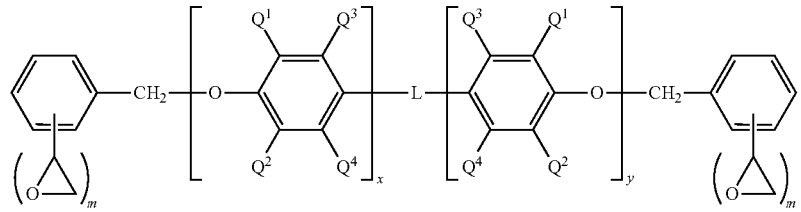

wherein L, $Q^1$-$Q^4$, m, x, and y are as defined above. In some embodiments, the poly(arylene ether) has the structure

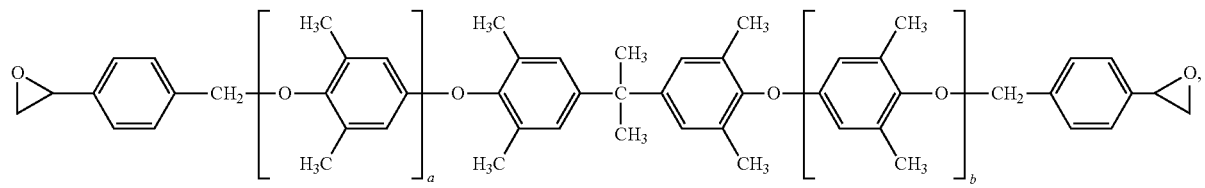

wherein each occurrence of a and b is independently 0 to about 20, provided that the sum of a and b is at least 2.

The curable composition can comprise the poly(arylene ether) in an amount of about 1 to about 99.9 weight percent, specifically about 3 to about 50 weight percent, more specifically about 5 to about 40 weight percent, and still more specifically about 10 to about 30 weight percent, based on the total weight of the curable composition.

In addition to the epoxybenzyl-terminated poly(arylene ether), the curable composition also comprises a curing promoter. The term "curing promoter" as used herein encompasses compounds whose roles in curing epoxy resins are variously described as those of a hardener, a hardening accelerator, a curing catalyst, and a curing co-catalyst, among others. Hardeners are coreactive curing agents. Hardeners react with the epoxy groups and/or the secondary hydroxyl groups of the epoxy resin. Suitable hardeners for epoxy resins are known in the art and include, for example, amines, dicyandiamide, polyamides, amidoamines, Mannich bases, anhydrides, phenol-formaldehyde resins, carboxylic acid functional polyesters, polysulfides, polymercaptans, isocyanates, cyanate esters, and combinations thereof.

In some embodiments, the curing promoter comprises an amine. The amine can be a polyamine, a tertiary amine, an amidine, and combinations thereof. Examples of suitable polyamines include amine hardeners such as isophoronediamine, triethylenetetraamine, diethylenetriamine, aminoethylpiperazine, 1,2- and 1,3-diaminopropane, 2,2-dimethylpropylenediamine, 1,4-diaminobutane, 1,6-diaminohexane, 1,7-diaminoheptane, 1,8-diaminooctane, 1,9-diaminononane, 1,12-diaminododecane, 4-azaheptamethylenediamine, N,N'-bis(3-aminopropyl)butane-1,4-diamine, cyclohexanediamine, 4,4'-methylenedianiline, diethyltoluenediamine, m-phenylenediamine, p-phenylenediamine, tetraethylenepentamine, 3-diethylaminopropylamine, 3,3'-iminobispropylamine, 2,4-bis(p-aminobenzyl)aniline, tetraethylenepentamine, 3-diethylaminopropylamine, 2,2,4- and 2,4,4-trimethylhexamethylenediamine, 1,2- and 1,3-diaminocyclohexane, 1,4-diamino-3,6-diethylcyclohexane, 1,2-diamino-4-ethylcyclohexane, 1,4-diamino-3,6-diethylcyclohexane, 1-cyclohexyl-3,4-diaminocyclohexane, 4,4'-diaminondicyclohexylmethane, 4,4'-diaminodicyclohexylpropane, 2,2-bis(4-aminocyclohexyl)propane, 3,3'-dimethyl-4,4'-diaminodicyclohexylmethane, 3-amino-1-cyclohexaneaminopropane, 1,3- and 1,4-bis(aminomethyl)cyclohexane, m- and p-xylylenediamine, diethyl toluene diamines, and combinations thereof. In some embodiments, the curing promoter comprises a hardener selected from the group consisting of m-phenylenediamine, 4,4'-diaminodiphenylmethane, and combinations thereof.

Examples of suitable amine compounds further include tertiary amine hardening accelerators such as triethylamine, tributylamine, dimethylaniline, diethylaniline, benzyldimethylamine (BDMA) α-methylbenzyldimethylamine, N,N-dimethylaminoethanol, N,N-dimethylaminocresol, tri(N,N-dimethylaminomethyl)phenol, and combinations thereof. Examples of suitable amine compounds further include imidazole hardening accelerators such as 2-methylimidazole, 2-ethylimidazole, 2-laurylimidazole, 2-heptadecylimidazole, 2-phenylimidazole, 4-methylimidazole, 4-ethylimidazole, 4-laurylimidazole, 4-heptadecylimidazole, 2-phenyl-4-methylimidazole, 2-phenyl-4-hydroxymethylimidazole, 2-ethyl-4-methylimidazole, 2-ethyl-4-hydroxymethylimidazole, 1-cyanoethyl-4-methylimidazole, 2-phenyl-4,5-dihydroxymethylimidazole, and combinations thereof. Examples of suitable amine compounds further include cyclic amidine hardening accelerators such as 4-diazabicyclo(2,2,2)octane (DABCO), diazabicycloundecene (DBU), 2-phenyl imidazoline, and combinations thereof.

The curing promoter can comprise other amine compounds. Examples of other suitable amine compounds include hardeners such as ketimines, which are the reaction products of ketones and primary aliphatic amines; polyetheramines, which are the reaction products of polyols derived from ethylene oxide or propylene oxide with amines; amine-terminated polyamides, prepared by the reaction of dimerized and trimerized vegetable oil fatty acids with polyamines; amidoamines, imidazolines, and combinations thereof, for example the reaction product of diethylene triamine and tall-oil fatty acid.

The curing promoter can comprise an anhydride hardener. Examples of suitable anhydrides include maleic anhydride (MA), phthalic anhydride (PA), hexahydro-o-phthalic anhydride (HEPA), tetrahydrophthalic anhydride (THPA), methyltetrahydrophthalic anhydride (MTHPA), methylhexahydrophthalic anhydride (MHHPA), nadic methyl anhydride (methyl himic anhydride, MHA), benzophenonetetracarboxylic diandydride (BTDA), tetrachlorophthalic anhydride (TCPA), pyromellitic dianhydride (PMDA), trimellitic anhydride (TMA), and combinations thereof.

The curing promoter can comprise a phenol-formaldehyde resin. Suitable phenol-formaldehyde resins include, for example, novolac type phenol resins, resole type phenol resins, aralkyl type phenol resins, dicyclopentadiene type phenol resins, terpene modified phenol resins, biphenyl type phenol resins, bisphenol type phenol resins, triphenylmethane type phenol resins, and combinations thereof.

The curing promoter can comprise a Mannich base. Examples of Mannich bases are the reaction products of an amine with phenol and formaldehyde, melamine-formaldehyde resins, urea-formaldehyde resins, and combinations thereof.

In addition to the tertiary amines listed above, the curing promoter can comprise other hardening accelerators. Suitable examples of other hardening accelerators are substituted ureas, for example 3-phenyl-1,1-dimethyl urea; the reaction product of phenyl isocyanate with dimethylamine; the reaction product of toluene diisocyanate with dimethylamine; quaternary phosphonium salts, such as tetraalkyl and alklytriphenylphosphonium halide; and combinations thereof.

The curing promoter can comprise a metal salt, for example a copper (II) or aluminum (III) salt of an aliphatic or aromatic carboxylic acid. Suitable examples of such salts include the copper (II), tin (II), and aluminum (III) salts of acetate, stearate, gluconate, citrate, benzoate, and like anions, as well as combinations thereof. The curing promoter can comprise a copper (II) or aluminum (III) β-diketonate. Suitable examples of such metal diketonates include the copper (II) and aluminum (III) salts of acetylacetonate. The curing promoter can comprise a borontrifluoride-trialkylamine complex. An illustrative boron trifluoride-trialkylamine complex is boron trifluoride-trimethylamine complex.

The curing promoter can comprise a latent cationic cure catalyst. Latent cationic cure catalysts are used, for example, in UV-cured epoxy resin compositions. Latent cationic cure catalysts include, for example, diaryliodonium salts, phosphonic acid esters, sulfonic acid esters, carboxylic acid esters, phosphonic ylides, triarylsulfonium salts, benzylsulfonium salts, aryldiazonium salts, benzylpyridinium salts, benzylammonium salts, isoxazolium salts, and combinations thereof. For example, the curing promoter can be a latent cationic cure catalyst comprising a diaryliodonium salt having the structure

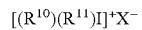

$$[(R^{10})(R^{11})I]^+X^-$$

wherein $R^{10}$ and $R^{11}$ are each independently a $C_6$-$C_{14}$ monovalent aromatic hydrocarbon radical, optionally substituted with from 1 to 4 monovalent radicals selected from $C_1$-$C_{20}$ alkyl, $C_1$-$C_{20}$ alkoxy, nitro, and chloro; and wherein $X^-$ is an anion. In some embodiments, the curing promoter is a latent cationic cure catalyst comprising a diaryliodonium salt having the structure

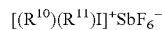

$$[(R^{10})(R^{11})I]^+SbF_6^-$$

wherein $R^{10}$ and $R^{11}$ are each independently a $C_6$-$C_{14}$ monovalent aromatic hydrocarbon radical, optionally substituted with from 1 to 4 monovalent radicals selected from $C_1$-$C_{20}$ alkyl, $C_1$-$C_{20}$ alkoxy, nitro, and chloro. In some embodiments, the curing promoter is a latent cationic cure catalyst comprising 4-octyloxyphenyl phenyl iodonium hexafluoroantimonate.

The amount of curing promoter will depend on the type of curing promoter, as well as the identities and amounts of the other components of the curable composition. For example, when the curing promoter is a latent cationic cure catalyst, it can be used in an amount of about 0.1 to about 10 parts by weight per 100 parts by weight total of the poly(arylene ether) and the auxiliary epoxy resin (if present). As another example, when the curing promoter is a copper (II) or aluminum (III) beta-diketonate, it can be used in an amount of about 1 to 10 parts by weight per 100 parts by weight of the poly(arylene ether) and the auxiliary epoxy resin (if present). As yet another example, when the curing promoter is an amine hardener, it can be used in an amount of about 2 to about 40 parts by weight, per 100 parts by weight of the poly(arylene ether) and the auxiliary epoxy resin (if present). As yet another example, when the curing promoter is an imidazole hardening accelerator, it can be used in an amount of about 0.01 to about 5 parts by weight, per 100 parts by weight of the poly(arylene ether) and the auxiliary epoxy resin (if present).

In some embodiments, the curing promoter comprises a hardener, and the curable composition comprises the curing promoter in an amount of about 0.1 to about 50 weight percent, specifically about 0.5 to about 30 weight percent, more specifically about 1 to about 20 weight percent, and still more specifically, about 2 to about 10 weight percent, based on the weight of the curable composition.

When the curing promoter comprises a hardener, its amount can be specified in terms of equivalents relative to total epoxy equivalents. For example, when the curing promoter comprises an amine hardener, the poly(arylene ether), the curing promoter, and auxiliary epoxy resin provide a ratio of total epoxy equivalents to total amine equivalents of about 1:1 to about 1.3:1, specifically about 1.1:1 to about 1.2:1, and still more specifically about 1.1:1 to about 1.2:1.

In some embodiments, the curable composition further comprises an auxiliary epoxy resin, in addition to the poly (arylene ether) and curing promoter. The auxiliary resin is different than the epoxybenzyl-terminated poly(arylene ether). Suitable auxiliary epoxy resins include those described by the structure

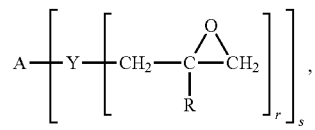

wherein A is a an organic or inorganic radical of valence n, Y is oxygen or nitrogen, r is 1 or 2 and consistent with the valence of X, R is hydrogen or methyl, s is 1 to about 1000, specifically 1 to 8, more specifically 2 or 3 or 4.

Suitable classes of auxiliary epoxy resins include, for example, aliphatic epoxy resins, cycloaliphatic epoxy resins, bisphenol A epoxy resins, bisphenol-F epoxy resins, phenol novolac epoxy resins, cresol-novolac epoxy resins, biphenyl epoxy resins, polyfunctional epoxy resins, naphthalene epoxy resins, divinylbenzene dioxide, 2-glycidylphenylglycidyl ether, dicyclopentadiene-type epoxy resins, multi-aromatic resin type epoxy resins, and combinations thereof.

Suitable auxiliary epoxy resins include those having the following structures

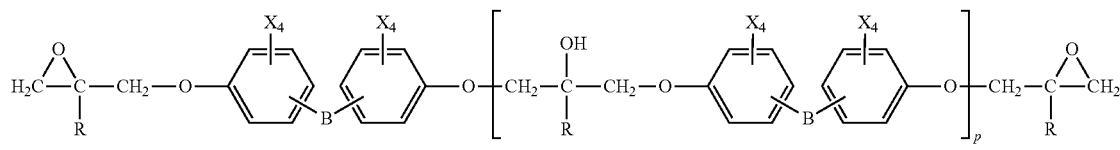

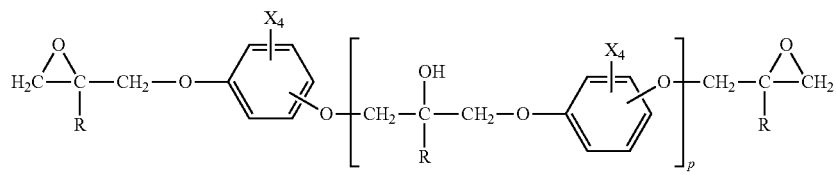

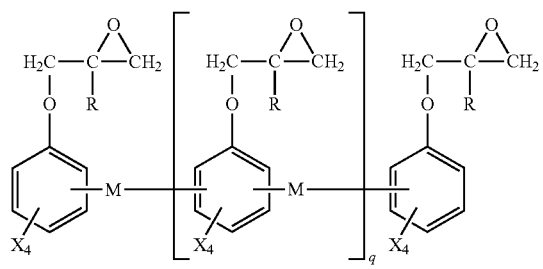

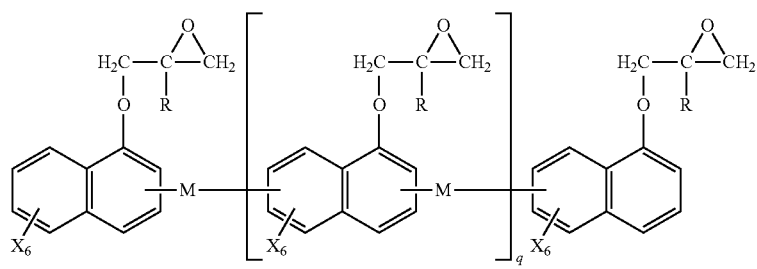

-continued

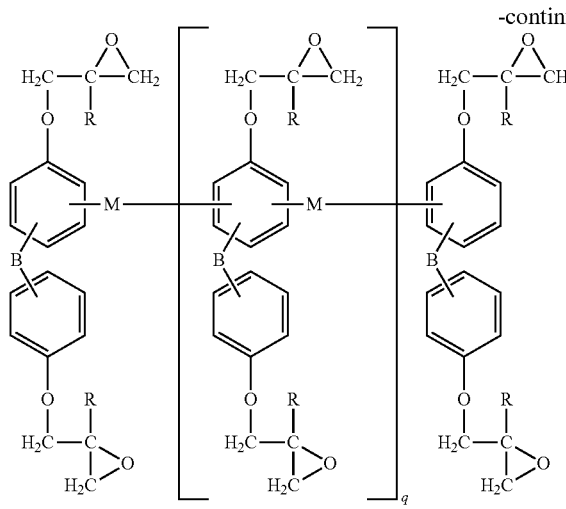
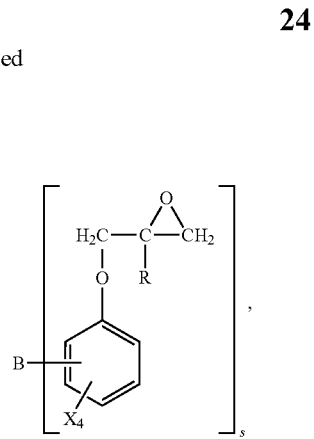

wherein each occurrence of R is independently hydrogen or methyl; each occurrence of M is independently $C_1$-$C_{18}$ hydrocarbylene optionally further comprising a member or members selected from oxirane, carboxy, carboxamide, ketone, aldehyde, alcohol, halogen, nitrile; each occurrence of X is independently hydrogen, chloro, fluoro, bromo, $C_1$-$C_{18}$ hydrocarbyl optionally further comprising a member or members selected from carboxy, carboxamide, ketone, aldehyde, alcohol, halogen, and nitrile; each occurrence of B is independently a carbon-carbon single bond, $C_1$-$C_{18}$ hydrocarbyl, $C_1$-$C_{12}$ hydrocarbyloxy, $C_1$-$C_{12}$ hydrocarbylthio, carbonyl, sulfide, sulfonyl, sulfonyl, phosphoryl, silane, or such groups further comprising a member or members selected from carboxyalkyl, carboxamide, ketone, aldehyde, alcohol, halogen, and nitrile; s is 1 to about 20; and each occurrence of p and q is independently 0 to about 20.

Suitable auxiliary epoxy resins include those produced by the reaction of epichlorohydrin or epibromohydrin with a phenolic compound. Suitable phenolic compounds include resorcinol, catechol, hydroquinone, 2,6-dihydroxynaphthalene, 2,7-dihydroxynapthalene, 2-(diphenylphosphoryl)hydroquinone, bis(2,6-dimethylphenol) 2,2'-biphenol, 4,4-biphenol, 2,2',6,6'-tetramethylbiphenol, 2,2',3,3',6,6'-hexamethylbiphenol, 3,3',5,5'-tetrabromo-2,2'6,6'-tetramethylbiphenol, 3,3'-dibromo-2,2',6,6'-tetramethylbiphenol, 2,2',6,6'-tetramethyl-3,3',5-tribromobiphenol, 4,4'-isopropylidenediphenol (bisphenol A), 4,4'-isopropylidenebis(2,6-dibromophenol) (tetrabromobisphenol A), 4,4'-isopropylidenebis(2,6-dimethylphenol) (teramethylbisphenol A), 4,4'-isopropylidenebis(2-methylphenol), 4,4'-isopropylidenebis(2-allylphenol), 4,4'-(1,3-phenylenediisopropylidene)bisphenol (bisphenol M), 4,4'-isopropylidenebis(3-phenylphenol), 4,4'-(1,4-phenylenediisoproylidene)bisphenol (bisphenol P), 4,4'-ethylidenediphenol (bisphenol E), 4,4'-oxydiphenol, 4,4'-thiodiphenol, 4,4'-thiobis(2,6-dimethylphenol), 4,4'-sulfonyldiphenol, 4,4'-sulfonylbis(2,6-dimethylphenol) 4,4'-sulfinyldiphenol, 4,4'-hexafluoroisoproylidene)bisphenol (Bisphenol AF), 4,4'-(1-phenylethylidene)bisphenol (Bisphenol AP), bis(4-hydroxyphenyl)-2,2-dichloroethylene (Bisphenol C), bis(4-hydroxyphenyl)methane (Bisphenol F), bis(2,6-dimethyl-4-hydroxyphenyl)methane, 4,4'-(cyclopentylidene)diphenol, 4,4'-(cyclohexylidene)diphenol (Bisphenol Z), 4,4'-(cyclododecylidene)diphenol 4,4'-bicyclo[2.2.1]heptylidene)diphenol, 4,4'-(9H-fluorene-9,9-diyl) diphenol, 3,3-bis(4-hydroxyphenyl)isobenzofuran-1(3H)-one, 1-(4-hydroxyphenyl)-3,3-dimethyl-2,3-dihydro-1H-inden-5-ol, 1-(4-hydroxy-3,5-dimethylphenyl)-1,3,3,4,6-pentamethyl-2,3-dihydro-1H-inden-5-ol, 3,3,3',3'-tetramethyl-2,2',3,3'-tetrahydro-1,1'-spirobi[indene]-5,6'-diol (spirobiindane), dihydroxybenzophenone (bisphenol K), tris(4-hydroxyphenyl)methane, tris(4-hydroxyphenyl) ethane, tris(4-hydroxyphenyl)propane, tris(4-hydroxyphenyl)butane, tris(3-methyl-4-hydroxyphenyl)methane, tris(3, 5-dimethyl-4-hydroxyphenyl)methane, tetrakis(4-hydroxyphenyl)ethane, tetrakis(3,5-dimethyl-4-hydroxyphenyl)ethane, bis(4-hydroxyphenyl) phenylphosphine oxide, dicyclopentadienylbis(2,6-dimethyl phenol), dicyclopentadienyl bis(2-methylphenol), dicyclopentadienyl bisphenol, and combinations thereof. In some embodiments, the epoxy resin comprises a bisphenol A diglycidyl ether epoxy resin (for example, a diglycidyl ether of 2,2-bis(4-hydroxyphenyl)propane).

Other suitable auxiliary epoxy resins include N-glycidyl phthalimide, N-glycidyl tetrahydrophthalimide, phenyl glycidyl ether, p-butylphenyl glycidyl ether, styrene oxide, neohexene oxide, ethylene glycol diglycidyl ether, polyethylene glycol diglycidyl ether, propylene glycol diglycidyl ether, polypropylene glycol diglycidyl ether, tetramethyleneglycol diglycidyl ether, polytetramethylene glycol diglycidyl ether, bisphenol A-type epoxy compounds, bisphenol S-type epoxy compounds, resorcinol-type epoxy compounds, phenol novolac-type epoxy compounds, ortho-cresol novolac-type epoxy compounds, adipic acid diglycidyl ester, sebacic acid diglycidyl ester, and phthalic acid diglycidyl ester. Also included are the glycidyl ethers of phenolic resins such as the glycidyl ethers of phenol-formaldehyde novolac, alkyl substituted phenol-formaldehyde resins including cresol-formaldehyde novolac, t-butylphenol-formaldehyde novolac, sec-butylphenol-formaldehyde novolac, tert-octylphenol-formaldehyde novolac, cumylphenol-formaldehyde novolac, decylphenol-formaldehyde novolac. Other useful auxiliary epoxy resins are the glycidyl ethers of bromophenol-formaldehyde novolac, chlorophenol-formaldehyde novolac, phenol-bis(hydroxymethyl)benzene novolac, phenol-bis(hydroxymethylbiphenyl) novolac, phenol-hydroxybenzaldehyde novolac, phenol-dicylcopentadiene novolac, naphthol-formaldehyde novolac, naphthol-bis(hydroxymethyl)benzene novolac, naphthol-bis(hydroxymethylbiphenyl) novolac, naphthol-hydroxybenzaldehyde novolac, naphthol-dicylcopentadiene novolac, and combinations thereof.

Also suitable as auxiliary epoxy resins are the polyglycidyl ethers of polyhydric aliphatic alcohols. Examples of such polyhydric aliphatic alcohols that can be mentioned are 1,4-butanediol, 1,6-hexanediol, polyalkylene glycols, glycerol, trimethylolpropane, 2,2-bis(4-hydroxy-cyclohexyl)propane, pentaerythritol, and combinations thereof.

Further suitable auxiliary epoxy resins are polyglycidyl esters which are obtained by reacting epichlorohydrin or similar epoxy compounds with an aliphatic, cycloaliphatic, or aromatic polycarboxylic acid, such as oxalic acid, adipic acid, glutaric acid, phthalic, isophthalic, terephthalic, tetrahydrophthalic or hexahydrophthalic acid, 2,6-naphthalenedicarboxylic acid, and dimerized fatty acids. Specific examples are diglycidyl terephthalate and diglycidyl hexahydrophthalate. Moreover, polyepoxide compounds which contain the epoxide groups in random distribution over the polymer chain, and which can be prepared by emulsion copolymerization using olefinically unsaturated compounds that contain these epoxide groups, such as, for example, glycidyl esters of acrylic or methacrylic acid, can be employed with advantage in some cases.

Examples of further auxiliary epoxy resins that can be used are those based on heterocyclic ring systems, for example hydantoin epoxy resins, triglycidyl isocyanurate and its oligomers, triglycidyl-p-aminophenol, triglycidyl-p-aminodiphenyl ether, tetraglycidyldiaminodiphenylmethane, tetraglycidyldiaminodiphenyl ether, tetrakis(4-glycidyloxyphenyl)ethane, urazole epoxides, uracil epoxides, and oxazolidinone-modified epoxy resins. Other examples are polyepoxides based on aromatic amines, such as aniline, for example N,N-diglycidylaniline, diaminodiphenylmethane, N,N-dimethylaminodiphenylmethane or N,N-dimethylaminodiphenyl sulfone; and cycloaliphatic epoxy resins such as 3,4-epoxycyclohexylmethyl-3,4-epoxycyclohexane carboxylate, 4,4'-(1,2-epoxyethyl)biphenyl, 4,4'-di(1, 2-epoxyethyl)diphenyl ether, and bis(2,3-epoxycyclopentyl) ether.

Oxazolidinone-modified epoxy resins are also suitable. Compounds of this kind are disclosed in, for example, *Angew. Makromol. Chem.*, vol. 44, (1975), pages 151-163, and U.S. Pat. No. 3,334,110 to Schramm. A specific example is the reaction product of bisphenol A diglycidyl ether with diphenylmethane diisocyanate in the presence of an appropriate accelerator.

Epoxy resin oligomers prepared by condensation of an epoxy resin with a phenol such as a bisphenol are also suitable. A typical example is the condensation of bisphenol A with a bisphenol A diglycidyl ether to produce an oligomeric diglycidyl ether. In another example a phenol dissimilar to the one used to derive the epoxy resin can be used. For example tetrabromobisphenol A can be condensed with bisphenol A diglycidyl ether to produce an oligomeric diglycidyl ether containing halogens.

Further suitable auxiliary epoxy resins as well as curing promoters are described in Henry Lee and Kris Neville, "Handbook of Epoxy Resins" McGraw-Hill Book Company, 1967, and Henry Lee "Epoxy Resins", American Chemical Society, 1970.

The auxiliary epoxy resin can be a solid at room temperature. Thus, in some embodiments, the epoxy resin has a softening point of 25° C. to about 150° C. Softening points can be determined according to ASTM E28-99 (2004), "Standard Test Methods for Softening Point of Resins Derived from Naval Stores by Ring-and-Ball Apparatus". The auxiliary epoxy resin can be a liquid or a softened solid at room temperature. Thus, in some embodiments, the auxiliary epoxy resin has a softening point less than 25° C.

In some embodiments, the curable composition comprises the auxiliary epoxy resin in an amount of 0 to about 99 weight percent, specifically about 1 to about 99 weight percent, more specifically about 10 to about 90 weight percent, still more specifically about 40 to about 85 weight percent, and even more specifically about 50 to about 80 weight percent, based on the total weight of the curable composition.

In some embodiments, the curable composition comprises about 1 to about 99.9 weight percent of the epoxybenzyl-terminated poly(arylene ether) and about 0.1 to 50 weight percent of the curing promoter, based on the total weight of the curable composition. In other embodiments, the curable composition comprises about 1 to about 99.9 weight percent of the epoxybenzyl-terminated poly(arylene ether), about 0.1 to 50 weight percent of the curing promoter, and about 1 to about 99 weight percent of the auxiliary epoxy resin, based on the total weight of the curable composition.

In addition to the poly(arylene ether), the curing promoter, and the auxiliary epoxy resin, the curable composition can, optionally, comprise a solvent. The solvent can have an atmospheric boiling point of about 50 to about 250° C. A boiling point in this range facilitates removal of solvent from the curable composition while minimizing or eliminating the effects of bubbling during solvent removal. The solvent promotes formation of a homogeneous resin mixture, which in turn provides wet-out and adhesion to the glass reinforcement of the prepreg. When solvent is present, the presence of the poly(arylene ether) increases the viscosity of the curable composition, reducing the flow of the curable composition at elevated temperatures, which is desirable for a lamination process.

The solvent can be, for example, a $C_3$-$C_8$ ketone, a $C_3$-$C_8$ N,N-dialkylamide, a $C_4$-$C_{16}$ dialkyl ether, a $C_6$-$C_{12}$ aromatic hydrocarbon, a $C_1$-$C_3$ chlorinated hydrocarbon, a $C_3$-$C_6$ alkyl alkanoate, a $C_2$-$C_6$ alkyl cyanide, or a combination thereof. The carbon number ranges refer to the total number of carbon atoms in the solvent molecule. For example, a $C_4$-$C_{16}$ dialkyl ether has 4 to 16 total carbon atoms, and the two alkyl groups can be the same or different. As other examples, the 3 to 8 carbon atoms in the "N,N-dialkylamide" include the carbon atom in the amide group, and the 2 to 6 carbons in the "$C_2$-$C_6$ alkyl cyanides" include the carbon atom in the cyanide group. Specific ketone solvents include, for example, acetone, methyl ethyl ketone, methyl isobutyl ketone, and combinations thereof. Specific $C_4$-$C_8$ N,N-dialkylamide solvents include, for example, dimethylformamide, dimethylacetamide, N-methyl-2-pyrrolidone (Chemical Abstracts Service Registry No. 872-50-4), and combinations thereof. Specific dialkyl ether solvents include, for example, tetrahydrofuran, ethylene glycol monomethylether, dioxane, and combinations thereof. In some embodiments, the $C_4$-$C_{16}$ dialkyl ethers include cyclic ethers such as tetrahydrofuran and dioxane. In some embodiments, the $C_4$-$C_{16}$ dialkyl ethers are noncyclic. The dialkyl ether can, optionally, further include one or more ether oxygen atoms within the alkyl groups and one or more hydroxy group substituents on the alkyl groups. The aromatic hydrocarbon solvent can comprise an ethylenically unsaturated solvent. Specific aromatic hydrocarbon solvents include, for example, benzene, toluene, xylenes, styrene, divinylbenzenes, and combinations thereof. The aromatic hydrocarbon solvent is preferably non-halogenated. That is, it does not include any fluorine, chlorine, bromine, or iodine atoms. Specific $C_3$-$C_6$ alkyl alkanoates include, for example, methyl acetate, ethyl acetate, methyl propionate, ethyl propionate, and combinations thereof. Specific $C_2$-$C_6$ alkyl cyanides include, for example, acetonitrile, propionitrile, butyronitrile, and combinations thereof. In some embodiments, the solvent is acetone. In some embodiments, the solvent is methyl ethyl ketone. In some embodiments, the solvent is methyl isobutyl ketone. In some embodiments, the solvent is N-methyl-2-pyrrolidone. In some embodiments, the solvent is dimethylformamide. In some embodiments, the solvent is ethylene glycol monomethyl ether.

When a solvent is utilized, the curable composition can comprise about 2 to about 100 parts by weight of the solvent, based on 100 parts by weight total of the poly(arylene ether), the curing promoter, and the auxiliary epoxy resin. Specifically, the solvent amount can be about 5 to about 80 parts by weight, more specifically about 10 to about 60 parts by weight, and even more specifically about 20 to about 40 parts by weight, based on 100 parts by weight total of the poly(arylene ether), the curing promoter, and the auxiliary epoxy resin. The solvent can be chosen, in part, to adjust the viscosity of the curable composition. Thus, the solvent amount can depend on variables including the type and amount of poly(arylene ether), the type and amount of curing promoter, the type and amount of auxiliary epoxy resin, and the processing temperature used for impregnation of the reinforcing structure with the curable composition.

The curable composition can further comprise an inorganic filler. Suitable inorganic fillers include, for example, alumina, silica (including fused silica and crystalline silica), boron nitride (including spherical boron nitride), aluminum nitride, silicon nitride, magnesia, magnesium silicate, glass fibers, glass mat, and combinations thereof. Suitable glass fibers include those based on E, A, C, ECR, R, S, D, and NE glasses, as well as quartz. The glass fiber can have a diameter of about 2 to about 30 micrometers, specifically about 5 to about 25 micrometers, more specifically about 5 to about 15 micrometers. The length of the glass fibers before compounding can be about 2 to about 7 millimeters, specifically about 1.5 to about 5 millimeters. Alternatively, longer glass fibers or continuous glass fibers can be used. The glass fiber can, optionally, include an adhesion promoter to improve its compatibility with the poly(arylene ether), the auxiliary epoxy resin, or both. Adhesion promoters include chromium complexes, silanes, titanates, zircon-aluminates, propylene maleic anhydride copolymers, reactive cellulose esters and the like. Suitable glass fiber is commercially available from suppliers including, for example, Owens Corning, Nippon Electric Glass, PPG, and Johns Manville.

When an inorganic filler is utilized, the curable composition can comprise about 2 to about 900 parts by weight of inorganic filler, based on 100 parts by weight total of the poly(arylene ether), the curing promoter, and the auxiliary epoxy resin. In some embodiments, the curable composition comprises about 100 to about 900 parts by weight inorganic filler, specifically about 200 to about 800 parts by weight inorganic filler, and more specifically about 300 to about 700 parts by weight inorganic filler, based on 100 parts by weight total poly(arylene ether), curing promoter, and auxiliary epoxy resin. In some embodiments, the curable composition comprises less than 50 parts by weight inorganic filler, or less than 30 parts by weight inorganic filler, or less than 10 parts by weight inorganic filler, based of 100 parts by weight total of the poly(arylene ether), the curing promoter, and the auxiliary epoxy resin. In some embodiments, the curable composition can be substantially free of inorganic filler (that is, the composition can comprises less than 0.1 weight percent of added inorganic filler, based 100 parts by weight of the poly(arylene ether), the curing promoter, and the auxiliary epoxy resin).

The curable composition can, optionally, further comprise one or more additives. Suitable additives include, for example, solvents, dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof.

In some embodiments, a method of forming a curable composition comprises mixing a poly(arylene ether), a curing promoter, and optionally, an auxiliary epoxy resin, wherein the poly(arylene ether) has the structure

wherein W is a divalent poly(arylene ether) residue terminated with phenolic oxygen atoms, and R is an epoxybenzyl group having the structure

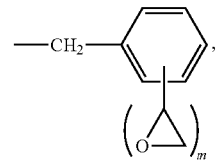

wherein each occurrence of R is the same or different, and each occurrence of m is independently 1 or 2. The poly(arylene ether), the curing promoter, and the auxiliary epoxy resin are further described above. The mixing is advantageously conducted at a temperature of about 10 to about 200° C., specifically about 20 to about 180° C., more specifically about 40 to about 160° C., still more specifically about 50 to about 150° C., and even more specifically about 60 to about 120° C., and yet more specifically at about 70 to about 110° C.

In some embodiments, a cured composition is obtained by curing a curable composition comprising a poly(arylene ether), a curing promoter, and optionally, an auxiliary epoxy resin, wherein the poly(arylene ether) has the structure

wherein W is a divalent poly(arylene ether) residue terminated with phenolic oxygen atoms, and R is an epoxybenzyl group having the structure

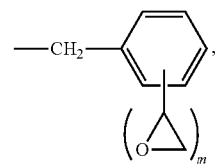

wherein each occurrence of R is the same or different, and each occurrence of m is independently 1 or 2. The poly(arylene ether), the curing promoter, and the auxiliary epoxy resin are further described above.

The cured composition exhibits several advantageous properties. In some embodiments, the cured composition exhibits excellent solvent resistance, for example resistance to toluene. In some embodiments, the surface of a microtomed slice of the cured composition is not etched by exposure to toluene at 23° C. for 15 seconds, as viewed under 3,000× magnification by scanning electron microscopy In some embodiments, the cured composition exhibits a single glass transition temperature. The presence of a single glass transition temperature, as opposed to two or more glass transition temperatures, indicates that the epoxybenzyl-terminated poly(arylene ether) is covalently bound to the epoxy resin matrix of the cured composition. In other words, the epoxybenzyl-terminated poly(arylene ether) does not exist as a separate phase within the epoxy resin matrix. Depending upon the type and relative amounts of poly(arylene ether), curing promoter, and auxiliary epoxy resin, the glass transition temperature of the cured composition can be about 100 to about 250° C., specifically about 120 to about 230° C., and more specifically about 140 to about 210° C. In some embodiments, the glass transition temperature is about 150 to about 200° C.

The composition can exhibit good impact strength. In some embodiments, the composition exhibits an unnotched Izod impact strength of at least 400 joules per meter, specifically about 400 to about 600 joules per meter, more specifically about 450 to about 550 joules per meter, and still more specifically about 480 to about 520 joules per meter, as measured at 23° C. with a hammer energy of 2 foot-pounds in accordance with ASTM D 4812-06.

In some embodiments, the cured composition can exhibit a dielectric constant of about 2.8 to about 3.2, specifically about 2.9 to about 3.1, and more specifically, about 3.00 to about 3.06, as measured at 1,000 megahertz in accordance with IPC-TM-650 2.5.5.9.

In some embodiments, the cured composition can exhibit a loss tangent of about 0.011 to about 0.017, specifically about 0.012 to about 0.016, and more specifically about 0.013 to about 0.015, as measured at 1,000 megahertz in accordance with IPC-TM-650 2.5.5.9.

In some embodiments, the cured composition can exhibit a water absorption of less than or equal to 5 weight percent, specifically less than or equal to 4 weight percent, more specifically less than or equal to 3 weight percent, and still more specifically less than or equal to 2 weight percent, measured after immersion in deionized water at 80° C. for 250 hours.

The cured composition can also exhibit a number of advantageous properties simultaneously. In some embodiments, the cured composition can exhibit at least one of the following properties: a glass transition temperature of about 150 to about 200° C.; a dielectric constant of about 2.8 to about 3.2, as measured at 1,000 megahertz in accordance with IPC-TM-650 2.5.5.9; a loss tangent of about 0.011 to about 0.017, as measured at 1,000 megahertz, in accordance with IPC-TM-650 2.5.5.9; and a water adsorption of less than or equal to 2 weight percent, measured after immersion in deionized water at 80° C. for 250 hours. In some embodiments, the cured composition can exhibit at least two of the properties. In other embodiments, the cured composition can exhibit at least three of the properties.

The advantageous properties of the cured composition make it ideally suited for forming certain articles. Thus, in some embodiments, an article comprises the cured composition obtained by curing a curable composition comprising a poly(arylene ether), a curing promoter, and optionally, an auxiliary epoxy resin, wherein the poly(arylene ether) has the structure

R—W—R, wherein W is a divalent poly(arylene ether) residue terminated with phenolic oxygen atoms, and R is an epoxybenzyl group having the structure

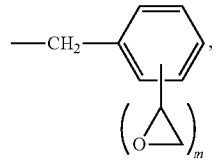

wherein each occurrence of R is the same or different, and each occurrence of m is independently 1 or 2. The poly(arylene ether), the curing promoter and the auxiliary epoxy resin are further described above.

The curable composition is particularly well suited for use in forming composites used for printed circuit boards. Methods of forming composites for use in printed circuit boards are known in the art and are described in, for example, U.S. Pat. No. 5,622,588 to Weber, U.S. Pat. No. 5,582,872 to Prinz, and U.S. Pat. No. 7,655,278 to Braidwood.

Thus, in some embodiments, a method of forming a composite comprises impregnating a reinforcing structure with a curable composition; partially curing the curable composition to form a prepreg; and laminating a plurality of prepregs; wherein the curable composition comprises a poly(arylene ether), a curing promoter, and optionally, an auxiliary epoxy resin; and wherein the poly(arylene ether) has the structure

R—W—R, wherein W is a divalent poly(arylene ether) residue terminated with phenolic oxygen atoms, and R is an epoxybenzyl group having the structure

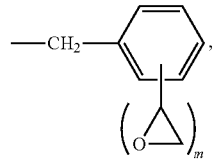

wherein each occurrence of R is the same or different, and each occurrence of m is independently 1 or 2. The poly(arylene ether), the curing promoter, and the auxiliary epoxy resin are further described above.

Reinforcing structures suitable for prepreg formation are known in the art. Suitable reinforcing structures include reinforcing fabrics. Reinforcing fabrics include those having complex architectures, including two or three-dimensional braided, knitted, woven, and filament wound. The curable composition is capable of permeating such complex reinforcing structures. The reinforcing structure can comprise fibers of materials known for the reinforcement of plastics material, for example fibers of carbon, glass, metal, and aromatic polyamides. Suitable reinforcing structures are described, for example, in Anonymous (Hexcel Corporation), "Prepreg Technology", March 2005, Publication No. FGU 017b; Anonymous (Hexcel Corporation), "Advanced Fibre Reinforced Matrix Products for Direct Processes", June 2005, Publication No. ITA 272; and Bob Griffiths, "Farnborough Airshow Report 2006", CompositesWorld.com, September 2006. The weight and thickness of the reinforcing structure are chosen according to the intended use of the composite using criteria well known to those skilled in the production of fiber reinforced resin composites. The reinforced structure can contain various finishes suitable for the epoxy matrix.

The method of forming the composite comprises partially curing the curable composition after the reinforcing structure has been impregnated with it. Partial curing is curing sufficient to reduce or eliminate the wetness and tackiness of the curable composition but not so great as to fully cure the composition. The resin in a prepreg is customarily in the partially cured state, and those skilled in the thermoset arts, and particularly the reinforced composite arts, understand the concept of partial curing and how to determine conditions to partially cure a resin without undue experimentation. References herein to properties of the "cured composition" refer to a composition that is substantially fully cured. For example, the resin in a laminate formed from prepregs is typically substantially fully cured. One skilled in the thermoset arts can determine whether a sample is partially cured or substantially fully cured without undue experimentation. For example, one can analyze a sample by differential scanning calorimetry to look for an exotherm indicative of additional curing occurring during the analysis. A sample that is partially cured will exhibit an exotherm. A sample that is substantially fully cured will exhibit little or no exotherm. Partial curing can be effected by subjecting the curable-composition-impregnated reinforcing structure to a temperature of about 133 to about 140° C. for about 4 to about 10 minutes.

Commercial-scale methods of forming composites are known in the art, and the curable compositions described herein are readily adaptable to existing processes and equipment. For example, prepregs are often produced on treaters. The main components of a treater include feeder rollers, a resin impregnation tank, a treater oven, and receiver rollers. The reinforcing structure (E-glass, for example) is usually rolled into a large spool. The spool is then put on the feeder rollers that turn and slowly roll out the reinforcing structure. The reinforcing structure then moves through the resin impregnation tank, which contains the curable composition. The varnish impregnates the reinforcing structure. After emerging from the tank, the coated reinforcing structure moves upward through the vertical treater oven, which is typically at a temperature of about 175 to about 200° C., and the solvent of the varnish is boiled away. The resin begins to polymerize at this time. When the composite comes out of the tower it is sufficiently cured so that the web is not wet or tacky. The cure process, however, is stopped short of completion so that additional curing can occur when laminate is made. The web then rolls the prepreg onto a receiver roll.

While the above-described curing methods rely on thermal curing, it is also possible to effect curing with radiation, including ultraviolet light and electron beams. Combinations of thermal curing and radiation curing can also be used.

In some embodiments, a composite is formed by a method comprising impregnating a reinforcing structure with a curable composition; partially curing the curable composition to form a prepreg; and laminating a plurality of prepregs; wherein the curable composition comprises a poly(arylene ether), a curing promoter, and optionally, an auxiliary epoxy resin; and wherein the poly(arylene ether) has the structure

wherein W is a divalent poly(arylene ether) residue terminated with phenolic oxygen atoms, and R is an epoxybenzyl group having the structure

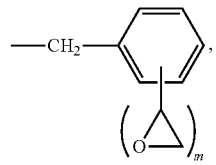

wherein each occurrence of R is the same or different, and each occurrence of m is independently 1 or 2. The poly(arylene ether), the curing promoter, and the auxiliary epoxy resin are further described above.

In some embodiments, a printed circuit board comprises a composite formed by a method comprising impregnating a reinforcing structure with a curable composition; partially curing the curable composition to form a prepreg; and laminating a plurality of prepregs; wherein the curable composition comprises a poly(arylene ether), a curing promoter, and optionally, an auxiliary epoxy resin; and wherein the poly(arylene ether) has the structure

R—W—R, wherein W is a divalent poly(arylene ether) residue terminated with phenolic oxygen atoms, and R is an epoxybenzyl group having the structure

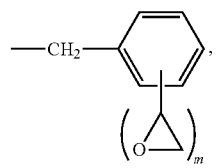

wherein each occurrence of R is the same or different, and each occurrence of m is independently 1 or 2. The poly(arylene ether), the curing promoter, and the auxiliary epoxy resin are further described above.

The invention includes at least the following embodiments.

Embodiment 1

A poly(arylene ether) having the structure

R—W—R, wherein W is a divalent poly(arylene ether) residue terminated with phenolic oxygen atoms, and R is an epoxybenzyl group having the structure

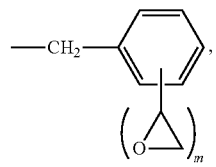

wherein each occurrence of R is the same or different, and each occurrence of m is independently 1 or 2.

Embodiment 2

The poly(arylene ether) of embodiment 1, having the structure

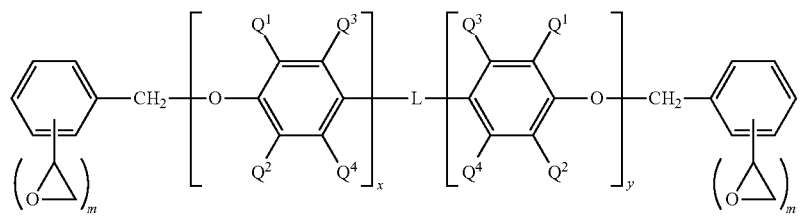

wherein each occurrence of m is independently 1 or 2; $Q^1$ and $Q^2$ are each independently selected from the group consisting of halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; each occurrence of $Q^3$ and $Q^4$ is independently selected from the group consisting of hydrogen, halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; x and y are independently 0 to about 30, provided that the sum of x and y is at least 2; and L has the structure

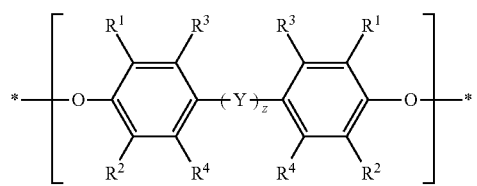

wherein each occurrence of $R^1$ and $R^2$ and $R^3$ and $R^4$ is independently selected from the group consisting of hydrogen, halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; z is 0 or 1; and Y has a structure selected from the group consisting of

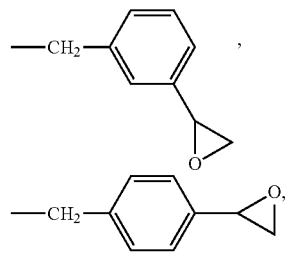

wherein each occurrence of $R^5$ is independently selected from the group consisting of hydrogen and $C_1$-$C_{12}$ hydrocarbyl, and each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

Embodiment 3

The poly(arylene ether) of embodiment 1 or 2, wherein the epoxybenzyl group is selected from the group consisting of

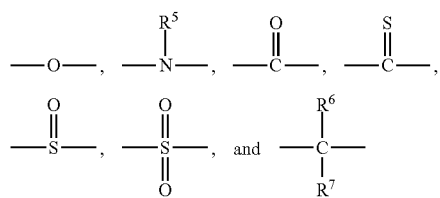

and a combination thereof.

Embodiment 4

A poly(arylene ether) having the structure

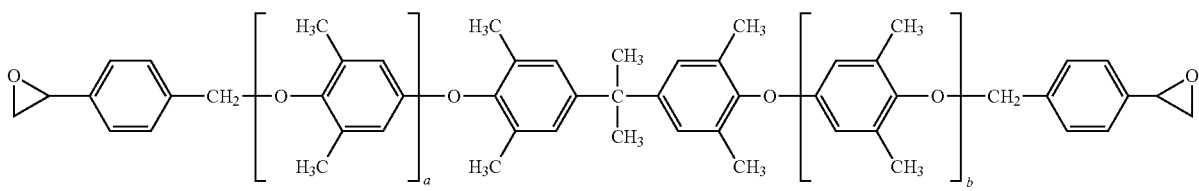

wherein each occurrence of a and b is independently 0 to about 20, provided that the sum of a and b is at least 2.

Embodiment 5

A process of making the poly(arylene ether) of claim 1, comprising reacting a peroxide-containing reagent with a vinylbenzyl-terminated poly(arylene ether).

Embodiment 6

The process of embodiment 5, wherein the vinylbenzyl-terminated poly(arylene ether) has the structure

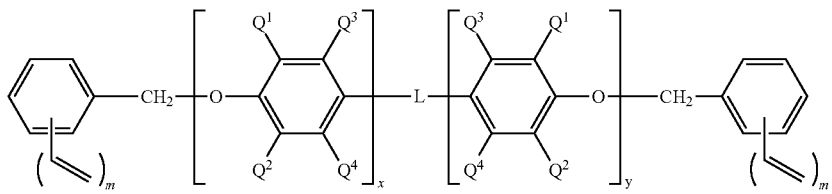

wherein each occurrence of m is independently 1 or 2; $Q^1$ and $Q^2$ are each independently selected from the group consisting of halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; each occurrence of $Q^3$ and $Q^4$ is independently selected from the group consisting of hydrogen, halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; x and y are independently 0 to about 30, provided that the sum of x and y is at least 2; and L has the structure

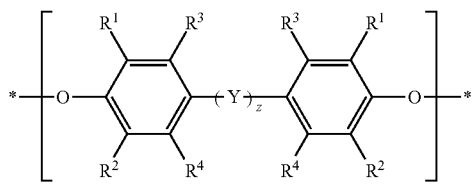

wherein each occurrence of $R^1$ and $R^2$ and $R^3$ and $R^4$ is independently selected from the group consisting of hydrogen, halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; z is 0 or 1; and Y has a structure selected from the group consisting of

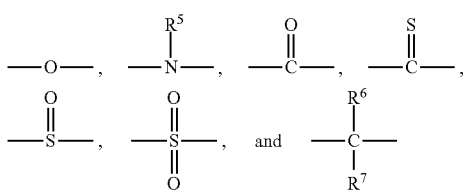

wherein each occurrence of $R^5$ is independently selected from the group consisting of hydrogen and $C_1$-$C_{12}$ hydrocarbyl, and each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

Embodiment 7

The process of embodiment 5 or 6, wherein the peroxide-containing reagent is an aliphatic or aromatic peracid selected from the group consisting of perbenzoic acid, 3-chloroperbenzoic acid, monoperphthalic acid, p-methoxyperbenzoic acid, p-nitroperbenzoic acid, m-nitroperbenzoic acid, α-pernaphthoic acid, β-pernaphthoic acid, phenylperacetic acid, performic acid, peracetic acid, perpropionic acid, perbutyric acid perisovaleric acid, perheptanoic acid, and combinations thereof.

Embodiment 8

The process of any of embodiments 5-7, further comprising reacting a hydroxyl terminated poly(arylene ether) with a vinylbenzyl halide in the presence of an alkali metal alkoxide to form the vinylbenzyl-terminated poly(arylene ether), wherein the vinylbenzyl halide has the structure

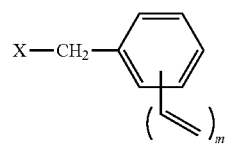

wherein X is fluoride, chloride, bromide, or iodide, and m is 1 or 2; and wherein the hydroxyl-terminated poly(arylene ether) has the structure

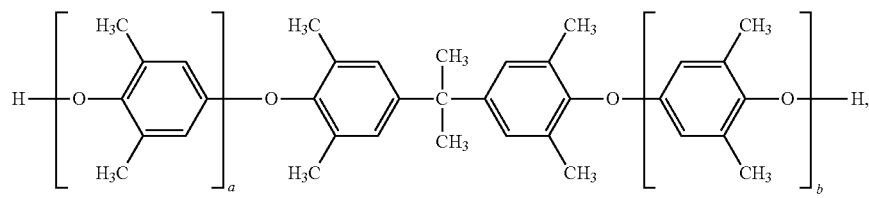

wherein each occurrence of a and b is independently 0 to about 20, provided that the sum of a and b is at least 2.

Embodiment 9

The process of embodiment 8, wherein the vinylbenzyl halide is 3-vinylbenzyl chloride, 4-vinylbenzyl chloride, or a combination thereof.

Embodiment 10

A process of making a poly(arylene ether), comprising:
reacting a hydroxyl-terminated poly(arylene ether) having the structure

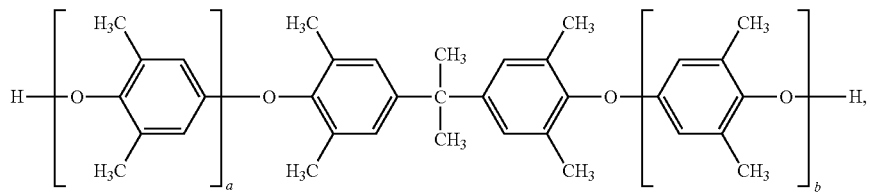

with 4-vinylbenzyl chloride to form a vinylbenzyl-terminated poly(arylene ether) having the structure

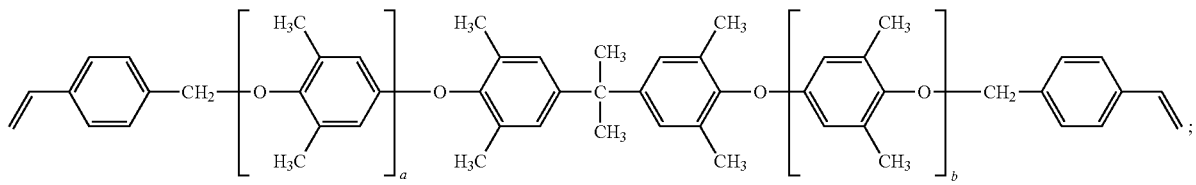

and reacting the vinylbenzyl-terminated poly(arylene ether) with a peracid to form an epoxybenzyl-terminated poly(arylene ether) having the structure

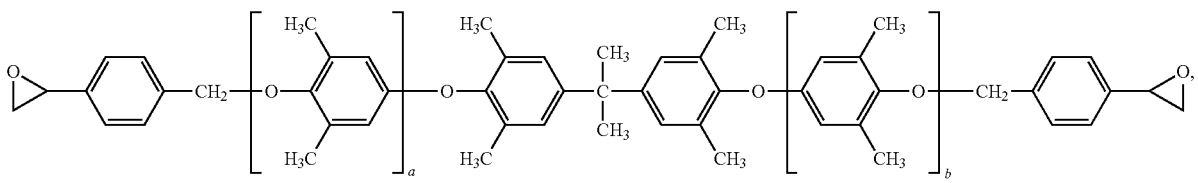

wherein each occurrence of a and b is independently 0 to about 20, provided that the sum of a and b is at least 2.

Embodiment 11

A curable composition comprising the poly(arylene ether) of embodiment 1, and a curing promoter.

Embodiment 12

The curable composition of embodiment 11, wherein the curing promoter comprises a hardener selected form the group consisting of amines, dicyandiamide, polyamides, amidoamines, Mannich bases, anhydrides, phenol-formaldehyde resins, carboxylic acid functional polyesters, polysulfides, polymercaptans, isocyanates, cyanate esters, and combinations thereof.

Embodiment 13

The curable composition of embodiment 11 or 12, wherein the curing promoter comprises an amine hardener, and wherein the poly(arylene ether) and the curing promoter provide a ratio of total epoxy equivalents to total amine equivalents of about 1:1 to about 1.3:1.

Embodiment 14

The curable composition of any of embodiments 11-13, wherein the curing promoter comprises a hardener selected from the group consisting of m-phenylenediamine, 4,4'-diaminodiphenylmethane, and combinations thereof.

Embodiment 15

The curable composition of any of embodiments 11-14, further comprising an auxiliary epoxy resin.

Embodiment 16

The curable composition of embodiment 15, wherein the auxiliary epoxy resin is selected from the group consisting of aliphatic epoxy resins, cycloaliphatic epoxy resins, bisphenol A epoxy resins, bisphenol-F epoxy resins, phenol novolac epoxy resins, cresol-novolac epoxy resins, biphenyl epoxy resins, polyfunctional epoxy resins, naphthalene epoxy resins, divinylbenzene dioxide, 2-glycidylphenylglycidyl ether, dicyclopentadiene-type epoxy resins, multi aromatic resin type epoxy resins, and combinations thereof.

Embodiment 17

The curable composition of embodiment 15 or 16, wherein the auxiliary epoxy resin comprises a diglycidyl ether of 2,2-bis(4-hydroxyphenyl)propane.

Embodiment 18

The curable composition of any of embodiments 15-17, wherein the curing promoter comprises an amine hardener, and wherein the poly(arylene ether), the curing promoter, and the auxiliary epoxy resin provide a ratio of total epoxy equivalents to total amine equivalents of about 1:1 to about 1.3:1.

Embodiment 19

The curable composition of any of embodiments 11-18, comprising about 1 to about 99.9 weight percent of the poly(arylene ether), and about 0.1 to 50 weight percent of the curing promoter, based on the total weight of the curable composition.

Embodiment 20

The curable composition of embodiment 19, further comprising about 1 to about 99 weight percent of an auxiliary epoxy resin, based on the total weight of the curable composition.

Embodiment 21

The curable composition of embodiment 19, further comprising about 2 to about 100 parts by weight of a solvent having an atmospheric boiling point of about 50 to about 250° C., based on 100 parts by weight total of the poly(arylene ether) and the curing promoter.

Embodiment 22

The curable composition of embodiment 20, further comprising about 2 to about 100 parts by weight of a solvent having an atmospheric boiling point of about 50 to about 250° C., based on 100 parts by weight total of the poly(arylene ether), the curing promoter, and the auxiliary epoxy resin.

Embodiment 23

The curable composition of embodiment 19, further comprising about 2 to about 900 parts by weight of an inorganic filler, based on 100 parts by weight total of the poly(arylene ether) and the curing promoter.

Embodiment 24

The curable composition of embodiment 20, further comprising about 2 to about 900 parts by weight of an inorganic filler, based on 100 parts by weight total of the poly(arylene ether), the curing promoter, and the auxiliary epoxy resin.

Embodiment 25

A process of making the curable composition of embodiment 11, comprising mixing the poly(arylene ether) and the curing promoter at about 10 to about 200° C.

Embodiment 26

A process of making the curable composition of embodiment 15, comprising mixing the poly(arylene ether), the curing promoter, and the auxiliary epoxy resin at about 10 to about 200° C.

Embodiment 27

A cured composition obtained by curing the curable composition of any of embodiments 11-14.

Embodiment 28

A cured composition obtained by curing the curable composition of any of embodiments 15-18.

Embodiment 29

The cured composition of embodiment 28, exhibiting a single glass transition temperature.

Embodiment 30

The cured composition of embodiment 28 or 29, having at least one of the following properties: a glass transition temperature of about 150 to about 200° C.; a dielectric constant of about 2.8 to about 3.2, as measured at 1,000 megahertz in accordance with IPC-TM-650 2.5.5.9; a loss tangent of about 0.011 to about 0.017, as measured at 1,000 megahertz in accordance with IPC-TM-650 2.5.5.9; and a water absorption of less than or equal to 2 weight percent, measured after immersion in deionized water at 80° C. for 250 hours.

Embodiment 31

The cured composition of any of embodiments 28-30, wherein a surface of a microtomed slice of the cured composition is not etched by exposure to toluene at 23° C. for 15 seconds, as viewed under 3,000× magnification by scanning electron microscopy.

Embodiment 32

An article comprising the cured composition of embodiment 27.

Embodiment 33

An article comprising the cured composition of embodiment 28.

Embodiment 34

A method of forming a composite, comprising: impregnating a reinforcing structure with the curable composition of any of embodiments 11-24; partially curing the curable composition to form a prepreg; and laminating a plurality of prepregs.

Embodiment 35

A composite formed by the method of embodiment 34.

Embodiment 36

A printed circuit board comprising a composite formed by the method of embodiment 34.

The invention is further illustrated by the following non-limiting examples.

Preparative Example 1

In a 500-milliliter three-neck flask equipped with a mechanical stirrer and nitrogen inlet tube, 90.0 grams of vinylbenzyl-terminated poly(arylene ether) (0.1125 moles of vinyl functionality) was dissolved in 300 milliliters chloroform. An ice/water bath was used to cool the solution to 0-5° C. Then 26.8 grams of 3-chloroperbenzoic acid (75% purity; 0.1165 moles) was added. The solution was stirred at 0-5° C. for 7 hours. As the reaction proceeded, 3-chlorobenzoic acid (a by-product) precipitated from solution.

The solution was stored at 0° C. overnight. The next day, the 3-chlorobenzoic acid precipitate was removed by centrifugation and decantation. The resulting clear solution was combined with methanol to precipitate the epoxybenzyl-terminated poly(arylene ether). The product was dried in a vacuum oven at 60° C. and 25 inches of vacuum for 16 hours. The weight of the product was 85 grams (approximately 95% yield).

The product was analyzed by proton nuclear magnetic resonance ($^1$H-NMR) spectroscopy using a Varian Mercury Plus 400 MHz $^1$H-NMR spectrometer. Peak assignments for the labeled protons in the terminal groups for the starting material and product indicated in the structures below are given Table 1.

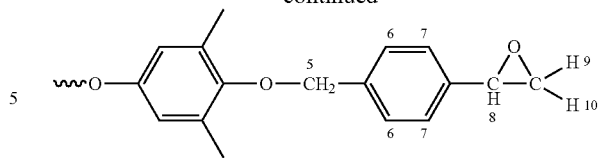

TABLE 1

| $^1$H-NMR Chemical Shifts | | | |
|---|---|---|---|
| Vinylbenzyl-terminated Poly(arylene ether) | | Epoxybenzyl-terminated Poly(arylene ether) | |
| Proton Number | Chemical Shift | Proton Number | Chemical Shift |
| 1 | 7.42 | 6 | 7.3 |
| 2 | 6.70, 6.74 | 7 | 7.44 |
| 3 | 5.76 | 8 | 3.88 |
| 4 | 5.25 | 9 | 3.15 |
| 5 | 4...75 | 10 | 2.80, 2.79 |
| — | — | 5 | 4.75 |

Examples 1-4 and Comparative Examples 1-4

Individual components used to prepare the cured compositions in the working examples are summarized in Table 2. The chemical structures and acronyms of the raw materials listed in Table 2 are provided below.

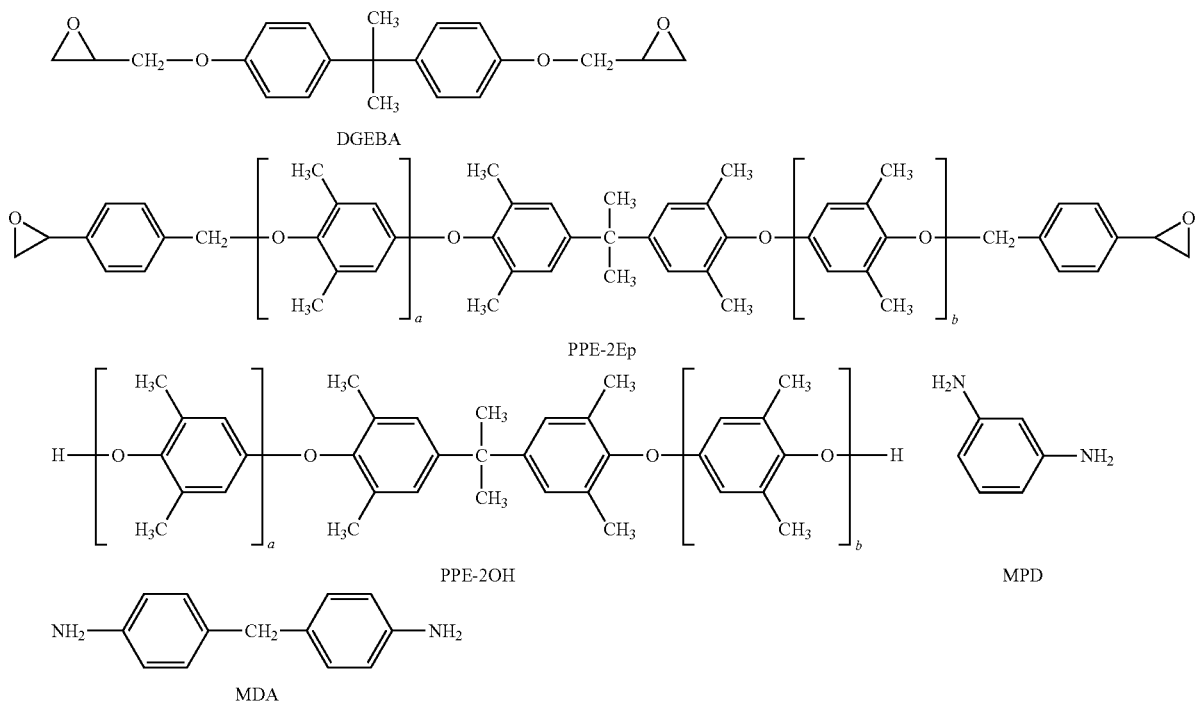

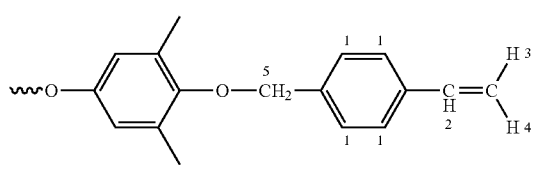

The epoxybenzyl-terminated poly(arylene ether) used in Examples 1-4 was that of Preparative Example 1. As reported in Table 2, epoxy equivalent weight (EEW) is the weight of resin in grams that contains one mole of epoxy groups. It is also the molecular weight of the resin divided by the number of epoxy groups in one molecule of resin. Hydroxyl equivalent weight (HEW) is the weight of resin in grams that contains one mole of hydroxyl groups. It is also the molecular weight of the resin divided by the number of hydroxyl groups in one molecule of resin Amine hydrogen equivalent weight (AHEW) is the weight of resin in grams that contains one mole of active (replaceable) amine hydrogen atoms. It is also the molecular weight of the resin divided by the number of active amine hydrogen atoms in one molecule of resin. Each of these equivalent weights is expressed in units of grams/equivalent (g/equiv). Conditions for preparing and curing the curable compositions are described below in the context of specific curable compositions.

TABLE 2

Raw Materials

| Name | Full Name | EEW[1] (g/equiv) | HEW[2] (g/equiv) | AHEW[3] (g/equiv) |
|---|---|---|---|---|
| DGEBA | 2,2-Bis(4-hydroxyphenyl)propane-epichlorohydrin polymer (diglycidyl ether of bisphenol A) | 173 | — | — |
| PPE-2Ep | Epoxybenzyl-terminated poly(arylene ether) | 784 | — | — |
| MPD | m-phenylenediamine | — | — | 27.04 |
| MDA | 4,4'-diaminodiphenylmethane | — | — | 49.57 |
| PPE-2OH | Hydroxyl-terminated poly(arylene ether) | — | 784 | — |

[1]Epoxide equivalent weight.
[2]Hydroxyl equivalent weight.
[3]Amine hydrogen equivalent weight.

Characterization of the Cured Compositions

Glass transition temperatures ($T_g$) were measured on a TA Instruments 2920 M-DS. The thermal scans were from 30 to 250° C. under a nitrogen atmosphere with a heating rate of 20° C./min.

Samples for Scanning Electronic Microscopy (SEM) were cut to size, microtomed to obtain a fresh, flat surface for analysis, and etched in toluene at 23° C. for 15 seconds. Then the samples were coated with gold. The samples were examined using a Carl Zeiss AG-EVO® 40 Series scanning electron microscope. The conditions were SEM mode, a probe current of 40 picoamps, HV (high vacuum), and an acceleration voltage of 20 kilovolts.

Dielectric constants and dissipation factors were measured at 23° C. according to IPC-TM-650 2.5.5.9. Test samples were in the shape of rectangular prisms having dimensions of 5 centimeters by 5 centimeters by 3.5 millimeters. The samples were conditioned at 23° C. and 50% relative humidity for a minimum of 24 hours before testing. The measuring cell was a Hewlett-Packard Impedance Material Analyzer Model 4291B and had a width of 27.5 centimeters, a height of 9.5 centimeters, and a depth of 20.5 centimeters. The electrodes were Hewlett-Packard Model 16453A and had a diameter of 7 millimeters. Measurements were conducted using a capacitance method, sweeping a range of frequencies when DC voltage was applied to the dielectric materials. The applied voltage was 0.2 millivolt to 1 volt at the frequency range of 1 megahertz to 1 gigahertz. Values for dielectric constants (Dk, relative permittivity) and loss tangent (Df, dissipation factor) at frequencies of 100 megahertz, 500 megahertz, and 1000 megahertz (1 gigahertz) were recorded.

Comparative Example 1

Epoxy/m-Phenylenediamine

DGEBA (20.00 grams, 0.1156 equivalents) was heated to 80-100° C. and MPD (2.78 grams, 0.1028 equivalents) was added and dissolved. The solution was transferred to an aluminum pan and placed in an oven at 100° C. After 1 hour the temperature was increased to 190° C. After 3 hours at 190° C., the oven was turned off and allowed to cool to ambient temperature overnight. The casting exhibited a $T_g$ of 194° C. The dielectric constants and loss tangents are provided in Table 3.

Comparative Example 2

25.8 Weight Percent Hydroxyl-Terminated Poly(Arylene Ether)/Epoxy/m-Phenylenediamine DGEBA (14.86 grams, 0.08588 equivalents) was heated to 80-100° C. and PPE-2OH (5.94 grams, 0.00758 equivalents) was added. After the PPE-2OH was dissolved in the DGEBA, MDA (2.22 grams, 0.08210 equivalents) was added and dissolved. The solution was transferred to an aluminum pan and placed in an oven at 100° C. After 1 hour the temperature was increased to 190° C. After 3 hours at 190° C., the oven was turned off and allowed to cool to ambient temperatures overnight. The casting exhibited two distinct $T_g$ values (155 and 186° C.). The dielectric constants and loss tangents are provided in Table 3.

Example 1

14.9 Weight Percent Epoxybenzyl-Terminated Poly(Arylene Ether)/Epoxy/m-Phenylenediamine DGEBA (17.02 grams, 0.09837 equivalents) was heated to 80-100° C. and PPE-2Ep (3.40 grams, 0.00434 equivalents) was added. After the PPE-2Ep was dissolved in the DGEBA, MPD (2.47 grams, 0.09135 equivalents) was added and dissolved. The solution was transferred to an aluminum pan and placed in an oven at 100° C. After 1 hour the temperature was increased to 190° C. After 3 hours at 190° C., the oven was turned off and allowed to cool to ambient temperature overnight. The casting exhibited a single $T_g$ of 193° C. The dielectric constants and loss tangents are provided in Table 3.

Example 2

25.8 Weight Percent Epoxybenzyl-Terminated Poly(Arylene Ether)/Epoxy/m-Phenylenediamine DGEBA (14.86 grams, 0.08588 equivalents) was heated to 80-100° C. and PPE-2Ep (5.94 grams, 0.00758 equivalents) was added. After the PPE-2Ep was dissolved in the DGEBA, MPD (2.22 grams, 0.08210 equivalents) was added and dissolved. The solution was transferred to an aluminum pan and placed in an oven at 100° C. After 1 hour the temperature was increased to 190° C. After 3 hours at 190° C., the oven was turned off and allowed to cool to ambient temperature overnight. The casting exhibited a $T_g$ of 192° C. The dielectric constants and loss tangents are provided in Table 3.

Comparative Example 3

Epoxy/4,4'-Diaminodiphenylmethane

DGEBA (20.00 grams, 0.1156 equivalents) was heated to 80-100° C. and the MDA (5.19 grams, 0.1029 equivalents) was added and dissolved. The solution was transferred to an aluminum pan and placed in an oven at 100° C. After 1 hour the temperature was increased to 190° C. After 3 hours at 190° C., the oven was turned off and allowed to cool to ambient temperature overnight. The casting exhibited a $T_g$ of 159° C. The dielectric constants and loss tangents are provided in Table 3.

Comparative Example 4

13.7 Weight Percent Hydroxyl-Terminated Poly(Arylene Ether)/Epoxy/4,4'-Diaminodiphenylmethane DGEBA (17.24 grams, 0.09965 equivalents) was heated to 80-100° C. and PPE-2OH (3.45 grams, 0.004398 equivalents) was added. After the PPE-2OH was dissolved in the DGBDA, MDA (4.57 grams, 0.09219 equivalents) was added and dissolved. The solution was transfer to an aluminum pan and placed in an oven at 100° C. After 1 hour the temperature was increased to 190° C. After 3 hours at 190° C., the oven was turned off and allowed to cool to ambient temperature overnight. The casting exhibited two distinct $T_g$ values (146 and 162° C.). The dielectric constants and loss tangents are provided in Table 3.

Example 3

13.7 Weight Percent Epoxybenzyl-Terminated Poly(Arylene Ether)/Epoxy/4,4'-Diaminodiphenylmethane DGEBA (17.24 grams, 0.09965 equivalents) was heated to 80-100° C. and PPE-2Ep (3.45 grams, 0.004398 equivalents) was added. After the PPE-2Ep was dissolved in the epoxy, MDA (4.57 grams, 0.09219 equivalents) was added and dissolved. The solution was transferred to an aluminum pan and placed in an oven at 100° C. After 1 hour the temperature was increased to 190° C. After 3 hours at 190° C., the oven was turned off and allowed to cool to ambient temperature overnight. The casting exhibited a $T_g$ of 167° C. The dielectric constants and loss tangents are provided in Table 3.

Example 4

24.2 Weight Percent Epoxybenzyl-Terminated Poly(Arylene Ether)/Epoxy/4,4'-Diaminodiphenylmethane DGEBA (15.02 grams, 0.08682 equivalents) was heated to 80-100° C. and the PPE-2Ep (6.11 grams, 0.007796 equivalents) was added. After the PPE-2Ep was dissolved in the epoxy, MDA (4.16 grams, 0.08392 equivalents) was added and dissolved. The solution was transferred to an aluminum pan and placed in an oven at 100° C. After 1 hour the temperature was increased to 190° C. After 3 hours at 190° C. the oven was turned off and allowed to cool to ambient temperature overnight. The casting exhibited a $T_g$ of 170° C. The dielectric constants and loss tangents are provided in Table 3.

TABLE 3

Properties of Cured Poly(arylene ether)/Epoxy/Diamine Compositions

| | | Dielectric Constant | | | Loss Tangent | | |
|---|---|---|---|---|---|---|---|
| | $T_g$ (° C.) | 100 MHz | 500 MHz | 1,000 MHz | 100 MHz | 500 MHz | 1,000 MHz |
| C. Ex. 1 | 194 | 3.124 | 3.075 | 3.053 | 0.01682 | 0.01645 | 0.01601 |
| C. Ex. 2 | 155, 186 | 3.027 | 2.984 | 2.965 | 0.01424 | 0.01402 | 0.01366 |
| Ex. 1 | 193 | 3.061 | 3.013 | 2.994 | 0.01502 | 0.01472 | 0.01440 |
| Ex. 2 | 192 | 3.016 | 2.973 | 2.954 | 0.01375 | 0.01350 | 0.01327 |
| C. Ex. 3 | 159 | 3.130 | 3.081 | 3.057 | 0.01701 | 0.01665 | 0.01617 |
| C. Ex. 4 | 146, 162 | 3.080 | 3.033 | 3.010 | 0.01582 | 0.0156 | 0.01501 |
| Ex. 3 | 167 | 3.074 | 3.026 | 3.004 | 0.01551 | 0.01520 | 0.01472 |
| Ex. 4 | 170 | 3.032 | 2.987 | 2.967 | 0.01403 | 0.01373 | 0.01347 |

The two MPD-cured epoxy resin systems comprising epoxybenzyl-terminated poly(arylene ether) each exhibited a single, high $T_g$ value (193 and 192° C. for Examples 1 and 2, respectively). However, the MPD-cured epoxy resin system comprising hydroxyl-terminated poly(arylene ether) (Comparative Example 2) exhibited two distinct $T_g$ values (155 and 186° C.), and both $T_g$ values are lower than the Tg of Example 2 (192° C.). These results indicate that at least a portion of the hydroxyl-terminated poly(arylene ether) is not covalently bonded to the epoxy matrix and instead exists as a separate phase in the cured composition, thus giving rise to the second $T_g$ peak. Similarly, the two MDA-cured epoxy resin systems comprising epoxybenzyl-terminated poly(arylene ether) each exhibited a single, high $T_g$ value (167 and 170° C. for Examples 3 and 4, respectively). However, the MDA-cured epoxy resin system comprising hydroxyl-terminated poly (arylene ether) (Comparative Example 4) exhibited two distinct $T_g$ values (146 and 162° C.), and both $T_g$ values are lower than the Tg of Example 3 (167° C.).

Example 5

Figure 2:
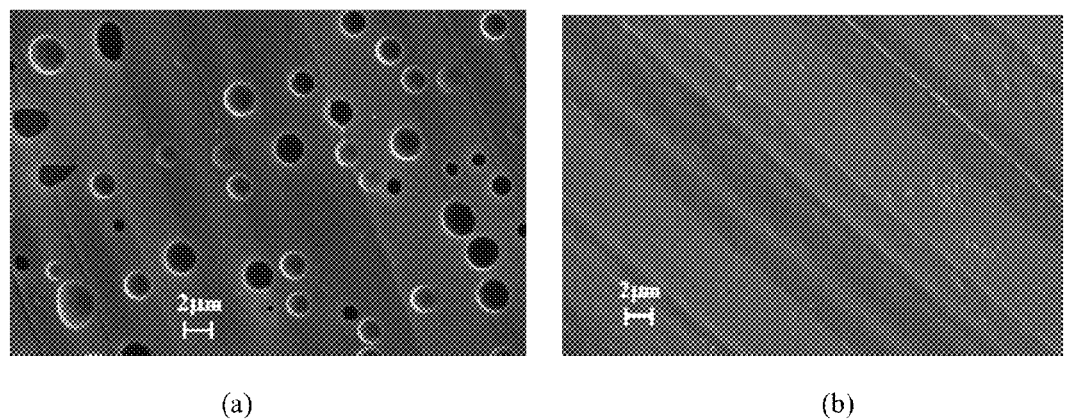
FIG. 2 depicts SEM images for cured 4,4'-diaminodiphenylmethane/epoxy/poly(arylene ether) compositions after toluene etching; in image (a), the poly(arylene ether) is a hydroxyl-terminated poly(arylene ether); in image (b), the poly(arylene ether) is an epoxybenzyl-terminated poly(arylene ether).

SEM was used to assess the incorporation of PPE-2Ep and PPE-2OH into the diamine/epoxy matrices. The surfaces of microtomed samples were etched in toluene for 15 seconds. Any unbound PPE-2OH or PPE-2Ep will be soluble in toluene, and therefore is expected to be removed from the surface. The SEM images of samples comprising PPE-2OH are presented in FIGS. 1(a) and 2(a), which clearly show surface voids. On the other hand, surface voids are not seen in the SEM images of samples comprising PPE-2OH presented in FIGS. 1(b) and 2(b). The images were all obtained at the same level of magnification—3000×. These results suggest that hydroxyl-terminated poly(arylene ether) is not covalently bonded to the epoxy matrix in the cured compositions, while epoxybenzyl-terminated poly(arylene ether) is covalently bonded. Thus epoxybenzyl-terminated poly(arylene ether) is a significant improvement over hydroxyl-terminated poly (arylene ether) in terms of solvent resistance.

Example 6

Unnotched impact strength was used to assess the incorporation of PPE-2Ep and PPE-2OH into the epoxy/diamine matrices on toughness. The results are summarized in Table 4 below. Unnotched Izod impact strength, expressed in joules per meter (J/m), was measured at 23° C. with a hammer energy of 2 foot-pounds in accordance with ASTM D 4812-06, "Standard Test Method for Unnotched Cantilever Beam Impact Strength of Plastics". Reported values reflect an average of 5 specimens per composition. As can be seen from the data, the impact strength of inventive Example 3 is improved relative to the epoxy resin of Comparative Example 3 and to the mixture of epoxy resin and PPE-2OH of Comparative Example 4. This indicates the improved incorporation of the PPE-2Ep into the epoxy/diamine matrix for the inventive PPE-2Ep relative to the comparative examples.

TABLE 4

Impact Strength of Cured Poly(arylene ether)/Epoxy/Diamine Compositions

| Ex. | Description | Impact Strength, J/m |
|---|---|---|
| C. Ex. 3 | DGEBA/MDA | 425 |
| C. Ex. 4 | 13.7 Weight percent PPE-2OH/DGEBA/MDA | 461 |
| Ex. 3 | 13.7 Weight percent PPE-2Ep/DGEBA/MDA | 506 |

Example 7

Water absorption in polymers is known to have adverse effects on dimensional stability, $T_g$, mechanical properties, and dielectric properties. Poly(arylene ether)s do not contain any polar groups which would strongly hydrogen bond to water, and therefore exhibit very low water absorption Amine cured epoxy resins can contain high levels of hydroxyl groups. A primary amine can generate two hydroxyl groups by reaction with two epoxy groups. Since hydroxyl groups and amine groups can form hydrogen bonds with water, epoxy resins have a tendency to absorb water.

Figure 3:
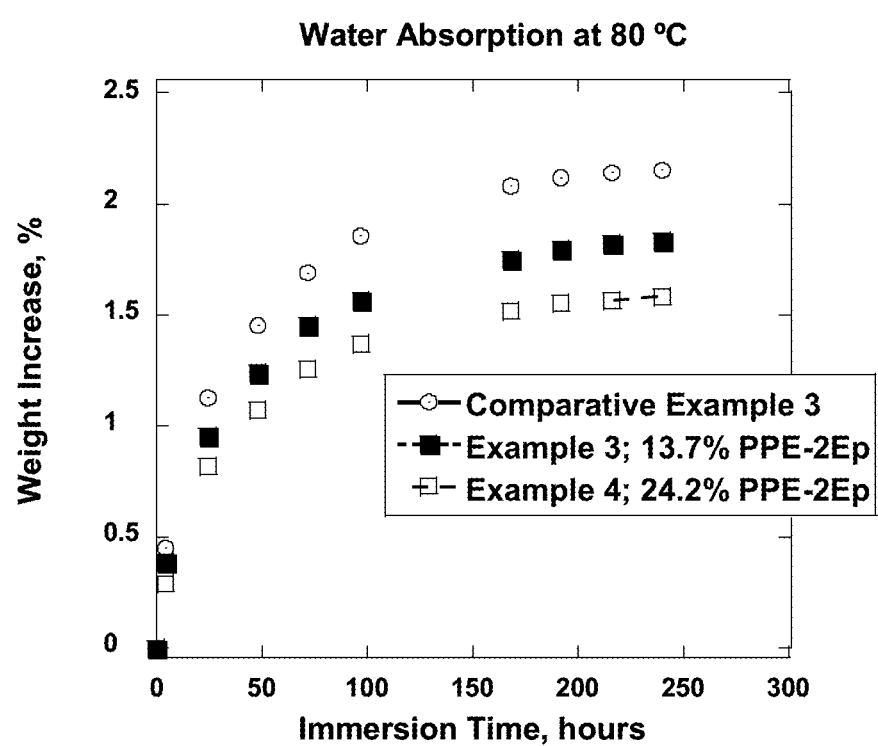
FIG. 3 is a graph of water absorption as a function of water immersion time at 80° C. for comparative and inventive cured 4,4'-diaminodiphenylmethane/epoxy compositions.

Water absorption as a function of PPE-2Ep content was measured for cured PPE-2Ep/DGEBA/MDA compositions of Comparative Example 3 and Examples 3 and 4 as a function of PPE-2Ep content by immersion of cured test samples in deionized water at 80° C. The water absorption was determined by removing the test samples periodically, weighing the test samples, and replacing them in the water. The results for Comparative Example 3, and Examples 3 and 4 are graphed in FIG. 3. As can be seen from FIG. 3, water absorption is reduced for the inventive compositions of Examples 3 and 4, and the reduction in water absorption is greatest for Example 4, which has the highest PPE-2Ep content.

This written description uses examples to disclose the invention, including the best mode, and also to enable any person skilled in the art to make and use the invention. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal language of the claims.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The invention claimed is:

1. A curable composition comprising:
   a poly(arylene ether) having the structure

R—W—R, wherein
   W is a divalent poly(arylene ether) residue terminated with phenolic oxygen atoms, and R is an epoxybenzyl group having the structure

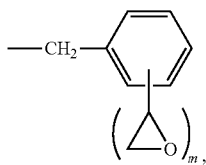

wherein each occurrence of R is the same or different, and each occurrence of m is independently 1 or 2; and
a curing promoter.

2. The curable composition of claim 1, wherein the poly(arylene ether) has the structure

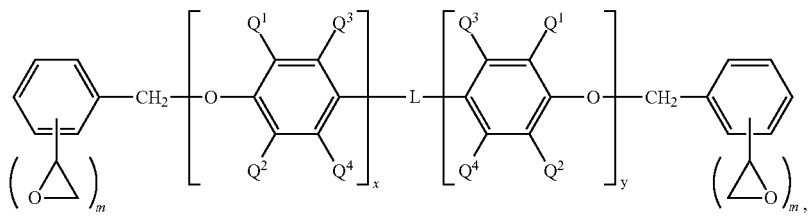

wherein each occurrence of m is independently 1 or 2; $Q^1$ and $Q^2$ are each independently selected from the group consisting of halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; each occurrence of $Q^3$ and $Q^4$ is independently selected from the group consisting of hydrogen, halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; x and y are independently 0 to about 30, provided that the sum of x and y is at least 2; and L has the structure

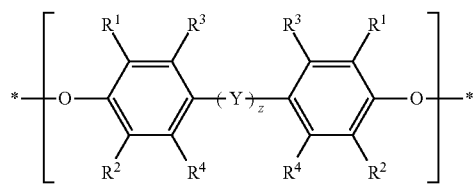

wherein each occurrence of $R^1$ and $R^2$ and $R^3$ and $R^4$ is independently selected from the group consisting of hydrogen, halogen, unsubstituted or substituted $C_1$-$C_{12}$ primary or secondary hydrocarbyl, $C_1$-$C_{12}$ hydrocarbylthio, $C_1$-$C_{12}$ hydrocarbyloxy, and $C_2$-$C_{12}$ halohydrocarbyloxy wherein at least two carbon atoms separate the halogen and oxygen atoms; z is 0 or 1; and Y has a structure selected from the group consisting of

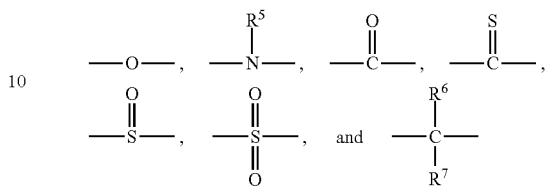

wherein each occurrence of $R^5$ is independently selected from the group consisting of hydrogen and $C_1$-$C_{12}$ hydrocarbyl, and each occurrence of $R^6$ and $R^7$ is independently selected from the group consisting of hydrogen, $C_1$-$C_{12}$ hydrocarbyl, and $C_1$-$C_6$ hydrocarbylene wherein $R^6$ and $R^7$ collectively form a $C_4$-$C_{12}$ alkylene group.

3. The curable composition of claim 1, wherein the poly(arylene ether) has the structure

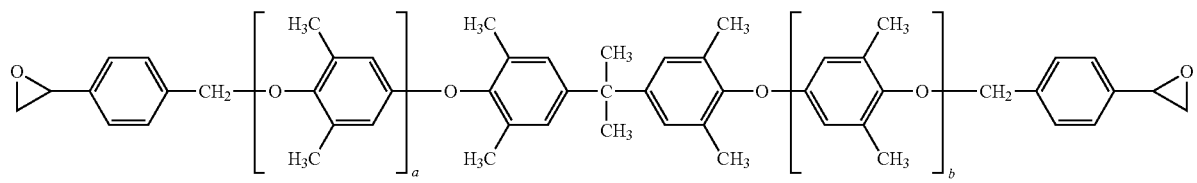

wherein each occurrence of a and b is independently 0 to about 20, provided that the sum of a and b is at least 2.

4. The curable composition of claim 1, wherein the curing promoter comprises a hardener selected form the group consisting of amines, dicyandiamide, polyamides, amidoamines, Mannich bases, anhydrides, phenol-formaldehyde resins, carboxylic acid functional polyesters, polysulfides, polymercaptans, isocyanates, cyanate esters, and combinations thereof.

5. The curable composition of claim 1, wherein the curing promoter comprises an amine hardener, and wherein the poly(arylene ether) and the curing promoter provide a ratio of total epoxy equivalents to total amine equivalents of about 1:1 to about 1.3:1.

6. The curable composition of claim 1, wherein the curing promoter comprises a hardener selected from the group consisting of m-phenylenediamine, 4,4'-diaminodiphenylmethane, and combinations thereof.

7. The curable composition of claim 1, further comprising an auxiliary epoxy resin.

8. The curable composition of claim 7, wherein the auxiliary epoxy resin is selected from the group consisting of aliphatic epoxy resins, cycloaliphatic epoxy resins, bisphenol A epoxy resins, bisphenol-F epoxy resins, phenol novolac epoxy resins, cresol-novolac epoxy resins, biphenyl epoxy resins, polyfunctional epoxy resins, naphthalene epoxy resins, divinylbenzene dioxide, 2-glycidylphenylglycidyl ether, dicyclopentadiene-type epoxy resins, multi aromatic resin type epoxy resins, and combinations thereof.

9. The curable composition of claim 7, wherein the auxiliary epoxy resin comprises a diglycidyl ether of 2,2-bis(4-hydroxyphenyl)propane.

10. The curable composition of claim 7, wherein the curing promoter comprises an amine hardener, and wherein the poly(arylene ether), the curing promoter, and the auxiliary epoxy resin provide a ratio of total epoxy equivalents to total amine equivalents of about 1:1 to about 1.3:1.

11. The curable composition of claim 1, comprising
about 1 to about 99.9 weight percent of the poly(arylene ether), and
about 0.1 to 50 weight percent of the curing promoter, based on the total weight of the curable composition.

12. The curable composition of claim 11, further comprising about 1 to about 99 weight percent of an auxiliary epoxy resin, based on the total weight of the curable composition.

13. The curable composition of claim 11, further comprising about 2 to about 100 parts by weight of a solvent having an atmospheric boiling point of about 50 to about 250° C., based on 100 parts by weight total of the poly(arylene ether) and the curing promoter.

14. The curable composition of claim 12, further comprising about 2 to about 100 parts by weight of a solvent having an atmospheric boiling point of about 50 to about 250° C., based on 100 parts by weight total of the poly(arylene ether), the curing promoter, and the auxiliary epoxy resin.

15. The curable composition of claim 11, further comprising about 2 to about 900 parts by weight of an inorganic filler, based on 100 parts by weight total of the poly(arylene ether) and the curing promoter.

16. The curable composition of claim 12, further comprising about 2 to about 900 parts by weight of an inorganic filler, based on 100 parts by weight total of the poly(arylene ether), the curing promoter, and the auxiliary epoxy resin.

17. A cured composition obtained by curing the curable composition of claim 1.

18. A cured composition obtained by curing the curable composition of claim 7.

19. The cured composition of claim 18, exhibiting a single glass transition temperature.

20. The cured composition of claim 18, having at least one of the following properties:
a glass transition temperature of about 150 to about 200° C.;
a dielectric constant of about 2.8 to about 3.2, as measured at 1,000 megahertz in accordance with IPC-TM-650 2.5.5.9;
a loss tangent of about 0.011 to about 0.017, as measured at 1,000 megahertz in accordance with IPC-TM-650 2.5.5.9; and
a water absorption of less than or equal to 2 weight percent, measured after immersion in deionized water at 80° C. for 250 hours.

21. The cured composition of claim 18, wherein a surface of a microtomed slice of the cured composition is not etched by exposure to toluene at 23° C. for 15 seconds, as viewed under 3,000× magnification by scanning electron microscopy.

22. An article comprising the cured composition of claim 17.

23. An article comprising the cured composition of claim 18.

24. A method of forming a composite, comprising
impregnating a reinforcing structure with the curable composition of claim 1;
partially curing the curable composition to form a prepreg; and
laminating a plurality of prepregs.

25. A composite formed by the method of claim 24.

26. A printed circuit board comprising a composite formed by the method of claim 24.

* * * * *